(12) United States Patent
Kamochi et al.

(10) Patent No.: US 10,287,458 B2
(45) Date of Patent: May 14, 2019

(54) LAMINATE FOR TREATMENT OF A WAFER DEVICE, TEMPORARY ADHESION COMPOSITION, AND TEMPORARY ADHESION FILM

(71) Applicant: FUJIFILM Corporation, Tokyo (JP)

(72) Inventors: Yoshitaka Kamochi, Shizuoka (JP); Yu Iwai, Shizuoka (JP); Mitsuru Sawano, Shizuoka (JP); Ichiro Koyama, Shizuoka (JP); Atsushi Nakamura, Zwijndrecht (BE)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/711,226

(22) Filed: Sep. 21, 2017

(65) Prior Publication Data

US 2018/0016471 A1 Jan. 18, 2018

Related U.S. Application Data

(63) Continuation of application No. PCT/JP2016/057906, filed on Mar. 14, 2016.

(30) Foreign Application Priority Data

Mar. 23, 2015 (JP) ................................ 2015-060078
Feb. 29, 2016 (JP) ................................ 2016-038245

(51) Int. Cl.
*C09J 7/00* (2018.01)
*B32B 7/12* (2006.01)
(Continued)

(52) U.S. Cl.
CPC ...................................... *C09J 7/00* (2013.01); *B32B 7/12* (2013.01); *B32B 27/00* (2013.01); *B32B 37/10* (2013.01);
(Continued)

(58) Field of Classification Search
CPC ...... C09J 7/00; C09J 5/04; C09J 201/00; C09J 2205/30; B32B 7/12; B32B 27/00;
(Continued)

(56) References Cited

U.S. PATENT DOCUMENTS

| 2011/0097576 A1 | 4/2011 | Habu et al. |
| 2012/0171844 A1 | 7/2012 | Hwang et al. |
| 2013/0285217 A1 | 10/2013 | Yamaguchi et al. |

FOREIGN PATENT DOCUMENTS

| CN | 101645427 A | 2/2010 |
| CN | 102029655 A | 4/2011 |
| CN | 103305140 A | 9/2013 |
| JP | 2002-220571 A | 8/2002 |

(Continued)

OTHER PUBLICATIONS

English translation of Written Opinion dated Jun. 14, 2016 in International Application No. PCT/JP2016/057906.

(Continued)

*Primary Examiner* — Scott B Geyer
(74) *Attorney, Agent, or Firm* — Sughrue Mion, PLLC

(57) ABSTRACT

A laminate includes, sequentially and adjacent to each other: a first base material; a temporary adhesion film; and a second base material, in which the tensile elastic modulus E of the temporary adhesion film at 25° C. in conformity with JIS K 7161:1994 is in a range of 25 to 2000 MPa. A base material is peeled off by fixing any one of the first base material and the second base material of the laminate at 25° C. and pulling an end portion of the other base material up in a direction perpendicular to the surface of the other base material from an interface with the temporary adhesion film at a speed of 50 mm/min, and the force applied during the pulling is measured using a force gauge and the value is 0.33 N/mm or less.

16 Claims, 3 Drawing Sheets

(51) Int. Cl.
| | |
|---|---|
| *B32B 27/00* | (2006.01) |
| *C09J 201/00* | (2006.01) |
| *B32B 37/10* | (2006.01) |
| *B32B 37/12* | (2006.01) |
| *B32B 38/00* | (2006.01) |
| *C09J 5/04* | (2006.01) |
| *H01L 21/683* | (2006.01) |

(52) U.S. Cl.
CPC .......... *B32B 37/12* (2013.01); *B32B 38/0012* (2013.01); *C09J 5/04* (2013.01); *C09J 201/00* (2013.01); *H01L 21/6836* (2013.01); *B32B 2307/54* (2013.01); *C09J 2205/30* (2013.01); *H01L 2221/6834* (2013.01); *H01L 2221/68386* (2013.01)

(58) Field of Classification Search
CPC ..... B32B 37/10; B32B 37/12; B32B 38/0012; B32B 2307/54; H01L 21/6836; H01L 2307/54; H01L 2221/6834; H01L 2221/68386
See application file for complete search history.

(56) References Cited

FOREIGN PATENT DOCUMENTS

| | | |
|---|---|---|
| JP | 2010-62540 A | 3/2010 |
| JP | 2010-242079 A | 10/2010 |
| JP | 2011-091220 A | 5/2011 |
| JP | 2013-241568 A | 12/2013 |
| JP | 2014-037458 A | 2/2014 |

OTHER PUBLICATIONS

International Preliminary Report on Patentability dated Sep. 26, 2017 in counterpart International Application No. PCT/JP2016/057906.
International Search Report dated Jun. 14, 2016 in International Application No. PCT/JP2016/057906.
Office Action dated Sep. 4, 2018 from the Japanese Patent Office in counterpart JP Application No. 2017-508229.
Office Action dated Nov. 19, 2018 from the Korean Intellectual Property Office in counterpart KR Application No. 10-2017-7026657.
Office Action dated Nov. 27, 2018, from the State Intellectual Property Office of People's Republic of China in counterpart Chinese Application No. 201680017461.7.

LAMINATE FOR TREATMENT OF A WAFER DEVICE, TEMPORARY ADHESION COMPOSITION, AND TEMPORARY ADHESION FILM

CROSS-REFERENCE TO RELATED APPLICATIONS

This application is a Continuation of PCT International Application No. PCT/JP20161057906 filed on Mar. 14, 2016, which claims priority under 35 U.S.C. § 119(a) to Japanese Patent Application No. 2015-060078 filed on Mar. 23, 2015 and Japanese Patent Application No. 2016-038245 filed on Feb. 29, 2016. Each of the above application(s) is hereby expressly incorporated by reference, in its entirety, into the present application.

BACKGROUND OF THE INVENTION

1. Field of the Invention

The present invention relates to a laminate, a temporary adhesion composition, and a temporary adhesion film. The present invention particularly relates to a laminate used for a treatment of a wafer device using a carrier base material and a temporary adhesion composition used for the laminate.

2. Description of the Related Art

In a process of manufacturing a semiconductor device such as an integrated circuit (IC) or a large scale integrated circuit (LSI), multiple IC chips are formed on a device wafer and separated by dicing.

With the needs for further miniaturization and higher performance of electronic devices, there has been a demand for further miniaturization and higher integration of IC chips to be mounted on electronic devices, but the higher integration of an integrated circuit in the plane direction of a device wafer approaches the limit.

As a method of electrically connecting an integrated circuit in an IC chip with an external terminal of the IC chip, a wire bonding method has been widely known conventionally. In recent years, for the purpose of miniaturization of IC chips, a method (a method of forming a so-called through-silicon via (TSV)) of providing a through-hole in a device wafer and connecting a metal plug serving as an external terminal with an integrated circuit such that the metal plug penetrates through the through-hole has been known. However, the needs for higher integration of recent IC chips described above cannot be satisfied only with the method of forming a through-silicon via.

In consideration of the above-described circumstances, a technique of improving the degree of integration per unit area of a device wafer by multilayering an integrated circuit in an IC chip has been known. However, since the multilayering of an integrated circuit increases the thickness of an IC chip, a member constituting the IC chip needs to be made thin. As a reduction in thickness of such a member, for example, a reduction in thickness of a device wafer has been examined. Since the reduction in thickness of a device wafer leads to not only miniaturization of an IC chip but also labor saving in a process of manufacturing through-holes in a device wafer while a through-silicon via is manufactured, this technique is considered promising. From the viewpoints of improving the degree of integration and improving the degree of freedom of a device structure, a reduction in thickness of a semiconductor device such as a powder device or an image sensor has also been attempted.

A device wafer having a thickness of approximately 700 to 900 μm has been widely known, but an attempt for reducing the thickness of a device wafer to 200 μm or less has been made recently for the purpose of miniaturization or the like of an IC chip.

However, since a device wafer having a thickness of 200 μm or less is extremely thin and a member for manufacturing a semiconductor device using such a device wafer as a base material is also extremely thin, it is difficult to stably support the member without damaging the member in a case where another treatment is performed on the member or the member is simply moved.

In order to solve the above-described problem, a technique of temporarily fixing (temporarily adhesion) a device wafer before the thickness thereof is reduced and a carrier base material to each other using a temporary adhesive, grinding the rear surface of the device wafer to reduce the thickness, and then peeling (detaching) the carrier base material from the device wafer has been known.

JP2013-241568A discloses a method of treating a base material including a step of temporarily fixing a base material onto a support through a temporary fixing member containing at least a member that contains a cycloolefin polymer and a compound having at least one structure selected from a diaryl silicone structure, a dialkyl silicone structure, a fluorinated alkyl structure, a fluorinated alkenyl structure, and an alkyl structure having 8 or more carbon atoms and at least one structure selected from a polyoxyalkylene structure, a structure having a phosphoric acid group, and a structure having a sulfo group to obtain a laminate, a step of processing the base material and/or moving the laminate, and a step of peeling the base material from the support by applying a force to the base material or the support in a direction substantially perpendicular to the surface of the base material in this order.

SUMMARY OF THE INVENTION

Here, according to the technique described in JP2013-241568A, the support (silicon wafer) can be peeled off from a carrier base material or a temporary adhesive without being broken. This technique is advantageous in that even a thin wafer is unlikely to be cracked so that the handling becomes easy. However, there is a problem in that warpage tends to occur in a case where the thickness of a wafer is reduced.

The present invention has been made in consideration of the above-described problem and an object thereof is to provide a laminate, a temporary adhesion composition, and a temporary adhesion film which are capable of making warpage less likely to occur even when a wafer is thin.

As the result of intensive research conducted by the present inventors under the above-described circumstances, it was found that the above-described problems can be solved by the following means <1> and preferably <2> to <17>.

<1> A laminate comprising, sequentially being adjacent to each other: a first base material; a temporary adhesion film; and a second base material, in which a tensile elastic modulus E of the temporary adhesion film at 25° C. in conformity with JIS K 7161:1994 is in a range of 25 to 2000 MPa, a base material is peeled off by fixing any one of a first base material and a second base material of the laminate at 25° C. and pulling an end portion of the other base material up in a direction perpendicular to the base material surface of the other base material from an interface with the temporary adhesion film at a speed of 50 mm/min, and the force applied during the pulling-up is measured using a force gauge and the value is 0.33 N/mm or less.

<2> The laminate according to <1>, in which a surface free energy of the temporary adhesion film is 30mJ/m² or less, where the surface free energy indicates a value obtained according to the extended Fowkes equation based on a contact angle of water, ethylene glycol, or diiodomethane with respect to the temporary adhesion film.

<3> The laminate according to <1> of <2>, in which a shear storage elastic modulus G' of the temporary adhesion film at 190° C. in conformity with JIS K 7244-6:1999 is in a range of 0.1 to 1 MPa.

<4> The laminate according to any one of <1> to <3>, in which a tensile storage elastic modulus E' of the temporary adhesion film at 25° C. in conformity with JIS K 7244-4: 1999 is in a range of 150 to 900 MPa.

<5> The laminate according to any one of <1> to <4>, in which a ratio E'/G' of the tensile storage elastic modulus E' of the temporary adhesion film at 25° C. in conformity with JIS K 7244-4:1999 to the shear storage elastic modulus G' of the temporary adhesion film at 190° C. in conformity with JIS K 7244-6:1999 satisfies a relationship of E'/G'≤3500.

<6> The laminate according to any one of <1> to <5>, in which the melt viscosity of the temporary adhesion film when the temperature is raised to 250° C. at a temperature rising rate of 5° C./min in conformity with JIS K 6862:1984 is 10000 Pa·s or greater.

<7> The laminate according to any one of <1> to <6>, in which a melt flow rate of the temporary adhesion film at 200° C. and at a load of 10 kg in conformity with JIS K 7210:1999 is 20.0 g/10 min or less.

<8> The laminate according to any one of <1> to <7>, in which a plastic deformation starting pressure $P_{60}$ of the temporary adhesion film at 60° C. is 0.2 MPa or greater, where the plastic deformation starting pressure is a pressure obtained when the film thickness of a pressed site is decreased by 10 μm or greater after a chip made of silicon having a size of 5 mm×10 mm is pressed for 5 seconds from a direction perpendicular to the film surface of the temporary adhesion film having a thickness of 40 μm provided on a silicon wafer while the temporary adhesion film is heated at 60° C., the chip is removed, and then the site in contact with the chip is observed using an optical microscope.

<9> The laminate according to any one of <1> to <8>, in which the temporary adhesion film is formed by forming a temporary adhesion composition on one surface of the first base material and the second base material according to a spin coating method, forming the temporary adhesion composition on one surface of the first base material and the second base material according to a blade coating method, or laminating a film-like temporary adhesion film on one surface of the first base material and the second base material by applying heat or a pressure.

<10> The laminate according to any one of <1> to <9>, in which one of the first base material and the second base material is a carrier base material and the other is a device wafer.

<11> The laminate according to <10>, in which the area of the film surface of the temporary adhesion film is smaller than the area of the base material surface of the carrier base material.

<12> The laminate according to <10>, in which an inequation of "(C−200)≥T≥D" is satisfied when the diameter of the base material surface of the carrier base material is set to C μm, the diameter of the base material surface of the device wafer is set to D μm, and the diameter of the film surface of the temporary adhesion film is set to T μm.

<13> The laminate according to <10>, in which an inequation of "(C−200)≥$T_C$≥$T_D$≥D" is satisfied when the diameter of the base material surface of the carrier base material is set to C μm, the diameter of the base material surface of the device wafer is set to D μm, the diameter of the film surface of the temporary adhesion film on a side where the temporary adhesion film is in contact with the carrier base material is set to $T_C$ μm, and the diameter of the film surface on a side where the temporary adhesion film is in contact with the device wafer is set to $T_D$ μm.

<14> The laminate according to any one of <1> to <13>, in which one of the first base material and the second base material is a carrier base material and the other is a device wafer having a thickness of 200 μm or less.

<15> The laminate according to any one of <1> to <14>, in which the temporary adhesion film contains a silicone compound in a proportion of 0.001 to 1% by mass with respect to the solid content in the temporary adhesion film.

<16> A temporary adhesion composition used for a laminate which includes a first base material, a temporary adhesion film obtained by film formation using a temporary adhesion composition, and a second base material sequentially being adjacent to each other, in which a base material is peeled off by fixing any one of a first base material and a second base material of the laminate at 25° C. and pulling an end portion of the other base material up in a direction perpendicular to the surface of the other base material from an interface with the temporary adhesion film at a speed of 50 mm/min, and the force applied during the pulling-up is measured using a force gauge and the value is 0.33 N/mm or less.

<17> A temporary adhesion film, in which a tensile elastic modulus E at 25° C. in conformity with JIS K 7161:1994 is in a range of 25 to 2000 MPa, a surface free energy is 30 mJ/m² or less, a shear storage elastic modulus G' at 190° C. in conformity with JIS K. 7244-6:1999 is in a range of 0.1 to 1 MPa, a tensile storage elastic modulus E' at 25° C. in conformity with JIS K 7244-4:1999 is in a range of 150 to 900 MPa, a ratio E'/G' of the tensile storage elastic modulus E' at 25° C. in conformity with JIS K 7244-4:1999 to the shear storage elastic modulus G' of the temporary adhesion film at 190° C. in conformity with JIS K 7244-6:1999 satisfies a relationship of E'/G'≤3500, the melt viscosity when the temperature is raised to 250° C. at a temperature rising rate of 5° C./min in conformity with JIS K 6862:1984 is 10000 Pa·s or greater, a melt flow rate at 200° C. and at a load of 10 kg in conformity with JIS K 7210:1999 is 20.0 g/10 min or less, and a plastic deformation starting pressure $P_{60}$ of the temporary adhesion film at 60° C. is 0.2 MPa or greater, where the surface free energy indicates a value obtained according to the extended Fowkes equation based on a contact angle of water, ethylene glycol, or diiodomethane with respect to the temporary adhesion film, and the plastic deformation starting pressure is a pressure obtained when the film thickness of a pressed site is decreased by 10 μm or greater after a chip made of silicon having a size of 5 mm×10 mm is pressed for 5 seconds from a direction perpendicular to the film surface of the temporary adhesion film having a thickness of 40 μm provided on a silicon wafer while the temporary adhesion film is heated at 60° C., the chip is removed, and then the site in contact with the chip is observed using an optical microscope.

According to the present invention, it is possible to provide a laminate, a temporary adhesion composition, and a temporary adhesion film which are capable of making warpage less likely to occur even when a wafer is thin.

DESCRIPTION OF THE PREFERRED EMBODIMENTS

Figure 1:
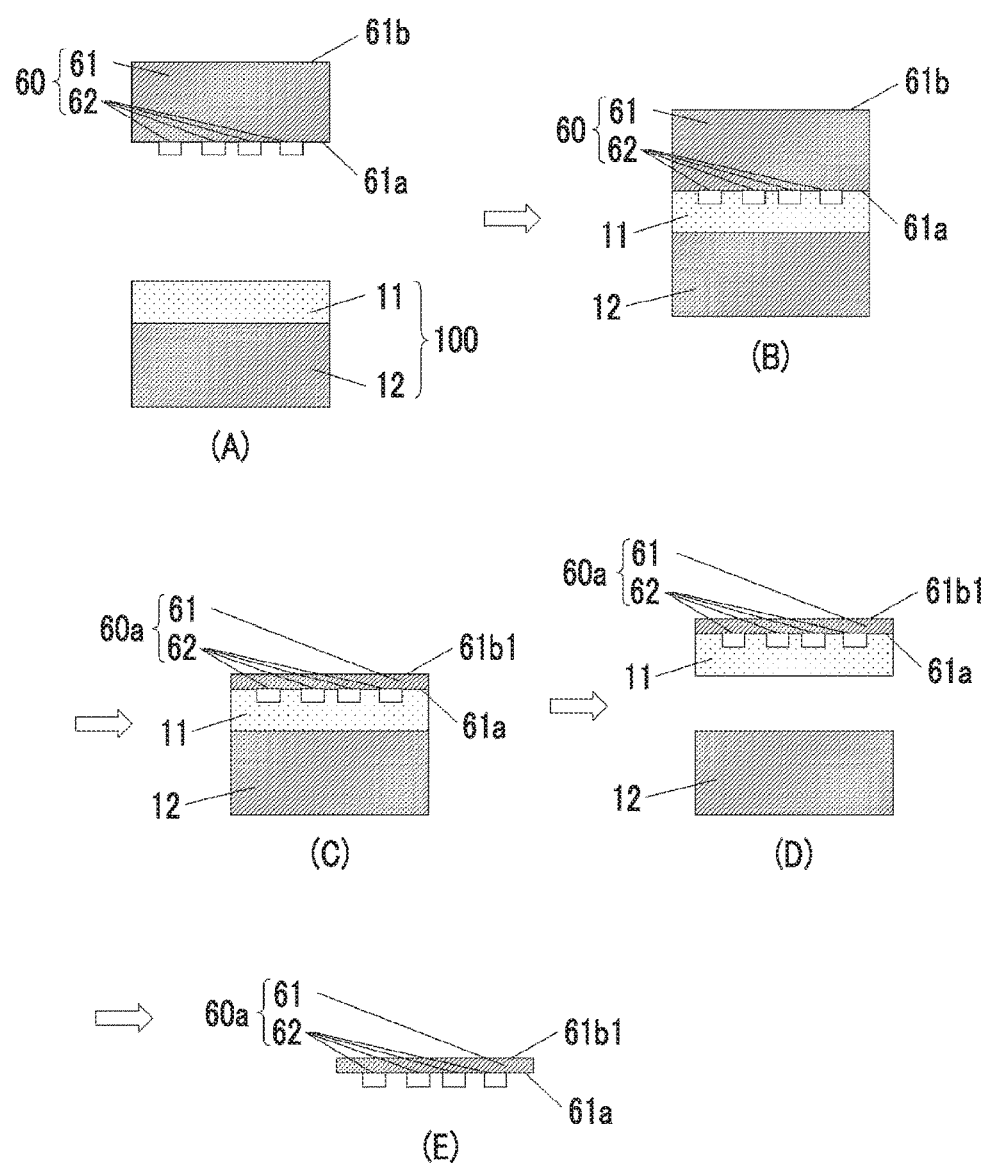
FIG. 1 is a view schematically illustrating a method of manufacturing a semiconductor device according to a first embodiment.

Hereinafter, the present invention will be described in detail. Further, the numerical ranges expressed using "to" in the present specification indicate the ranges including the numerical values described before and after "to" as the lower limits and the upper limits.

In regard to notation of a group (atomic group) in the present specification, in a case Where it is not noted whether a group includes a substituent or not, it means that a group with a substituent and a group without a substituent are both included. For example, when an "alkyl group" is noted, an alkyl group without a substituent (unsubstituted alkyl group) as well as an alkyl group with a substituent (substituted alkyl group) are included.

Further, "active rays" or "radiation" in the present specification includes visible light rays, ultraviolet rays, fat-ultraviolet rays, electron beams, and X-rays.

Further, the concept of "exposure" in the present specification, unless otherwise specified, includes not only exposure to light but also drawings using particle beams such as electron beams or ion beams. Examples of the light used for exposure typically include active light rays or radiation such as a bright line spectrum of a mercury lamp, far-ultraviolet rays typified by an excimer laser, extreme ultraviolet rays (EUV light), X-rays, and electron beams.

In the present specification, the total solid content indicates the total mass of components obtained by removing solvents from the total compositions.

In the present specification, "(meth)acrylate" indicates acrylate and methacrylate, "(meth)acryl" indicates acryl and methacryl, and "(meth)acryloyl" indicates "acryloyl" and "methacryloyl".

In the present specification, the weight-average molecular weight and the number average molecular weight are defined as a value obtained by gel permeation chromatography (GPC) measurement in terms of polystyrene. In the present specification, a weight-average molecular weight (Mw) and a number average molecular weight (Mn) can be acquired, for example, using an HLC-8220 (manufactured by TOSOH CORPORATION), a TSKgel Super AWM-H (inner diameter of 6.0 mm ID×15.0 cm, manufactured by TOSOH CORPORATION) as a column, and a 10 mmol/L, lithium bromide NMP (N-methylpyrrolidone) solution as an eluant.

In the present specification, a "lipophilic group" indicates a functional group which does not contain a hydrophilic group. Further, a "hydrophilic group" indicates a functional group exhibiting an affinity for water.

Hereinafter, in embodiments described below, members or the like which have been already described with reference to the referenced drawings are denoted by the same reference numerals or the corresponding numerals and the description thereof is simplified or omitted.

A laminate of the present invention includes a first base material; a temporary adhesion film; and a second base material, in this order and adjacent to each other, in which a tensile elastic modulus E of the temporary adhesion film at 25° C. in conformity with JIS (Japanese Industrial Standards) K 7161:1994 (hereinafter, also simply referred to as the "tensile elastic modulus E") is in a range of 25 to 2000 MPa, a base material can be peeled off by fixing any one of a first base material and a second base material of the laminate at 25° C. and pulling an end portion of the other base material up in a direction perpendicular to the surface of the other base material from an interface with the temporary adhesion film at a speed of 50 mm/min, and the force applied during the pulling-up is measured using a force gauge and the value is 0.33 N/mm or less. With this configuration, warpage can be effectively suppressed even when a wafer is thin. Here, the expression "the temporary adhesion film at 25° C." indicates a state in which the temporary adhesion film is maintained in a temperature condition of 25° C. for 3 minutes. Other temperature conditions are considered in the same manner.

In the present invention, it is preferable that at least one of the surface free energy of the temporary adhesion film, a shear storage elastic modulus G' of the temporary adhesion film at 190° C., a tensile storage elastic modulus E' of the temporary adhesion film at 25° C., and a ratio E'/G' of the tensile storage elastic modulus E' to the shear storage elastic modulus G, the melt viscosity of the temporary adhesion film, the melt flow rate (MFR) of the temporary adhesion film, and the plastic deformation starting pressure of the temporary adhesion film satisfies a predetermined value. With this configuration, warpage of a thin wafer can be effectively and particularly suppressed even when a wafer is thin.

Further, the present invention discloses a temporary adhesion film in which the tensile elastic modulus E, the surface free energy, the shear storage elastic modulus G' at 190° C., the tensile storage elastic modulus F' at 25° C., and the ratio E'/G' of the tensile storage elastic modulus E' to the shear storage elastic modulus G', the melt viscosity, the melt flow rate (MFR), and the plastic deformation starting pressure satisfies predetermined values.

In the present invention, the tensile elastic modulus E of the temporary adhesion film is in a range of 25 to 2000 MPa. Here, the tensile elastic modulus E of the temporary adhesion film indicates a value obtained according to a method described in the examples below. In addition, in a case where a determination device or the like used in the examples is unavailable due to discontinued production or the like, the measurement can be performed using another device having the same performance as the performance of the determination device used in the examples. The same applies to a case where the measurement method of the examples is taken into consideration.

The lower limit of the tensile elastic modulus E of the temporary adhesion film is preferably 28 MPa or greater, more preferably 30 MPa or greater, and still more preferably 40 MPa or greater. The upper limit thereof is preferably 1500 MPa or less, more preferably 500 MPa or less, still more preferably 100 MPa or less, and particularly preferably 70 MPa or less.

In the present invention, the surface free energy of the temporary adhesion film is preferably 30 mJ/m² or less. When the surface free energy thereof is in this range, the warpage of a thin wafer can be effectively suppressed.

Here, the surface free energy of the temporary adhesion film indicates a numerical value obtained by acquiring each contact angle formed when water, ethylene glycol, and diiodomethane are dropped onto the temporary adhesion film, establishing a simultaneous linear equation from the extended Fowkes equation, and acquiring the solution. Specifically, the surface free energy is obtained according to a method described in the examples below.

The upper limit of surface free energy of the temporary adhesion film according to the present invention is preferably 29 mJ/m² or less and more preferably 28 mJ/m² or less. The lower limit is not particularly limited, but is preferably 23 mJ/m² or greater and more preferably 24 mJ/m² or greater.

In the present invention, the shear storage elastic modulus G' of the temporary adhesion film at 190° C. in conformity with JIS K 7244-6:1999 (hereinafter, also simply referred to as the "shear storage elastic modulus G'") is preferably in a range of 0.1 to 1 MPa. When the shear storage elastic modulus is in this range, the warpage of a thin wafer can be more effectively suppressed. Here, the shear storage elastic modulus G' of the temporary adhesion film indicates a value obtained according to a method described in the examples below.

The lower limit of the shear storage elastic modulus G' of the temporary adhesion film according to the present invention is preferably 0.13 MPa or greater, more preferably 0.15 MPa or greater, and still more preferably 0.24 MPa or greater. The upper limit of the shear storage elastic modulus G' thereof is preferably 0.8 MPa or less, more preferably 0.5 MPa or less, still more preferably 0.45 MPa or less, and even still more preferably 0.4 MPa or less.

In the present invention, the tensile storage elastic modulus E' of the temporary adhesion film at 25° C. in conformity with JIS K 7244-4:1999 (hereinafter, also simply referred to as the "tensile storage elastic modulus E'") is preferably in a range of 150 to 900 MPa. When the shear storage elastic modulus is in this range, the warpage of a thin wafer can be more effectively suppressed. Here, the tensile storage elastic modulus E'; of the temporary adhesion film indicates a value obtained according to a method described in the examples below.

The lower limit of the tensile storage elastic modulus E' according to the present invention is preferably 160 MPa or greater, more preferably 170 MPa or greater, still more preferably 200 MPa or greater, particularly preferably 250 MPa or greater, and more particularly preferably 300 MPa or greater. The upper limit of the tensile storage elastic modulus E' thereof is preferably 600 MPa or less, more preferably 500 MPa or less, and particularly preferably 480 MPa or less.

In the present invention, it is preferable that the ratio E'/G' of the tensile storage elastic modulus E' to the shear storage elastic modulus G' satisfies a relationship of "E'/G'≤3500". When the ratio thereof is in this range, the warpage of a thin wafer can be more effectively suppressed.

The upper limit of the ratio E'/G' of the present invention is preferably 3200 or less, more preferably 2000 or less, and still more preferably 1500 or less. The lower limit of the ratio E'/G' is preferably 200 or greater, more preferably 300 or greater, still more preferably 800 or greater, and particularly preferably 900 or greater.

The melt viscosity of the temporary adhesion film of the present invention when the temperature is raised to 250° C. at a temperature rising rate of 5° C./min in conformity with JIS K 6862:1984 (hereinafter, also simply referred to as the "melt viscosity") is preferably 10000 Pa·s or greater. When the melt viscosity thereof is in this range, the warpage of a thin wafer can be more effectively suppressed. Here, the melt viscosity of the temporary adhesion film indicates a value obtained according to a method described in the examples below.

The lower limit of the melt viscosity of the temporary adhesion film is preferably 10500 Pa·s or greater and more preferably 12000 Pa·s or greater. Further, the upper limit of the melt viscosity of the temporary adhesion film is preferably 70000 Pa·s or less, more preferably 60000 Pa·s or less, still more preferably 15000 Pa·s or less, and particularly preferably 14000 Pa·s or less.

The melt flow rate of the temporary adhesion film of the present invention at 200° C. and at a load of 10 kg in conformity with JIS K 7210:1999 (hereinafter, also simply referred to as the "MFR") is preferably 20 g/10 min or less. When the melt flow rate thereof is in this range, the warpage of a thin wafer can be more effectively suppressed. Here, the MFR of the temporary adhesion film indicates a value obtained according to a method described in the examples below.

The upper limit of the MFR of the temporary adhesion film is preferably 17.0 g/10 min or less and more preferably 15.0 g/10 min or less. The lower limit of the MFR of the temporary adhesion film is preferably 3.0 g/10 min or greater and can be set to 7.0 g/10 min or greater or 10.0 g/10 min or greater.

Particularly in a case where a process of heating a device wafer carried by the temporary adhesion film at 200° C. or higher is performed, the upper limit of the MFR of the temporary adhesion film is preferably 17.0 g/10 min or less and more preferably 15.0 g/10 min or less. Further, in the same case as described above, the lower limit of the MFR of the temporary adhesion film is preferably 0.001 g/1.0 min or greater, more preferably 0.01 g/10 min or greater, and still more preferably 0.1 g/10 min or greater.

The plastic deformation starting pressure $P_{60}$ of the temporary adhesion film of the present invention at 60° C. (hereinafter, also simply referred to as the "plastic deformation starting pressure") is preferably 0.2 MPa or greater. When the plastic deformation starting pressure is in this range, the warpage of a thin wafer can be more effectively suppressed. Here, the plastic deformation starting pressure is a pressure obtained when the film thickness of a pressed site is decreased by 10 μm or greater after a chip made of silicon having a size of 5 mm×10 mm is pressed for 5 seconds from a direction perpendicular to the film surface of the temporary adhesion film having a thickness of 40 μm provided on a silicon wafer while the temporary adhesion film is heated at 60° C., the chip is removed, and then the site in contact with the chip is observed using an optical microscope. More specifically, the plastic deformation starting pressure indicates a value obtained according to a method described in the examples below.

The lower limit of the plastic deformation starting pressure is preferably 0.3 MPa or greater and more preferably 0.35 MPa or greater. The upper limit of the plastic deformation starting pressure is preferably 60.0 MPa or less, more preferably 10.0 MPa or less, still more preferably 1.0 MPa or less, and particularly preferably 0.9 MPa or less.

Next, the details of the configuration of the laminate according to the present invention will be described.

As described above, the laminate of the present invention includes, sequentially being adjacent to each other, a first base material; a temporary adhesion film; and a second base material. One of the first base material and the second base material is typically used as a carrier base material (fixing member) and the other is used as a thin device wafer.

Examples of the carrier base material include various wafers such as a silicon wafer, a SiC wafer, and a GaN wafer; substrates made of various materials such as glass and an organic base material; and substrates on which an organic film or an inorganic film is formed. The thickness of the carrier base material is not particularly limited, but is preferably in a range of 300 μm to 100 mm and more preferably in a range of 300 μm to 10 mm.

As the device wafer, known device wafers can be used without limitation and examples of the known wafers include a silicon substrate and a compound semiconductor substrate. Specific examples of the compound semiconductor substrate include a SiC substrate, a SiGe substrate, a ZnS substrate, a ZnSe substrate, a GaAs substrate, an InP substrate, and a GaN substrate.

A mechanical structure or a circuit may be formed on the surface of a device wafer. Examples of the device wafer on which a mechanical structure or a circuit is formed include micro electro mechanical systems (MEMS), a power device, an image sensor, a microsensor, a light emitting diode (LED), an optical device, an interposer, an implantable device, and a microdevice.

It is preferable that the device wafer has a structure of a metal bump or the like. According to the present invention, temporary adhesion can be stably carried out with respect to a device wafer whose surface has a structure and the temporary adhesion with respect to the device wafer can be easily released. The height of the structure is not particularly limited, but is preferably in a range of 1 to 150 μm and more preferably in a range of 5 to 100 μm.

In the present invention, the film thickness of the device wafer before a mechanical or chemical treatment is performed is preferably 500 μm or greater, more preferably 600 μm or greater, and still more preferably 700 μm or greater. The upper limit thereof is preferably 2000 μm or less and more preferably 1500 μm or less.

The film thickness of the thinned device wafer after the mechanical or chemical treatment is performed is preferably less than 500 μM, more preferably 400 μm or less, more preferably 300 μm or less, still more preferably 200 μm or less, and even still more preferably 50 μm or less. The lower limit thereof is preferably 1 μm or greater and more preferably 5 μm or greater.

The laminate of the present invention can be produced by heating and crimping the first base material, the second base material, and the temporary adhesion film. Preferably, the temporary adhesion film is formed on one surface of the first base material and the second base material, and the other one between the first base material and the second base material is disposed on the surface opposite to the one base material of the temporary adhesion film and then heated and crimped. Further, the laminate can be produced by disposing the temporary adhesion film between the first base material and the second base material and heating and crimping the laminate. It is preferable that the laminate is heated and crimped under a temperature condition of 100° C. to 210° C. at a pressure of 0.01 to 1 MPa for 1 to 15 minutes.

The material of the temporary adhesion film of the present invention is not particularly limited as long as the above-described various physical properties are satisfied, but it is preferable that the temporary adhesion film contains at least one binder. The means for obtaining the temporary adhesion film satisfying the above-described physical properties can be determined as appropriate and means for combining two or more specific binders may be exemplified. Further, the physical properties can be adjusted by formulating one specific binder and a plasticizer.

In a case where the temporary adhesion film of the present invention contains a binder, the proportion of the binder is preferably in a range of 50.00 to 99.99% by mass, more preferably in a range of 70.00 to 99.99% by mass, and particularly preferably in a range of 88.00 to 99.99% by mass with respect to the total solid content of the temporary adhesion film.

In a case where an elastomer is used as a binder, the proportion of the elastomer is preferably in a range of 50.00 to 99.99% by mass, more preferably in a range of 70.00 to 99.99% by mass, and particularly preferably in a range of 88.00 to 99.99% by mass with respect to the total solid content of the temporary adhesion film.

The details of the binder will be described later.

It is preferable that the temporary adhesion film of the present invention contains a fluorine-based liquid compound. The lower limit of the content ratio of the fluorine-based liquid compound in the temporary adhesion film of the present invention is preferably 0.001% by mass or greater and more preferably 0.002% by mass or greater, still more preferably 0.01% by mass or greater, even still more preferably 0.03% by mass or greater, particularly preferably 0.04% by mass or greater, or more particularly 0.05% by mass or greater with respect to the total solid content of the temporary adhesion film. The upper limit of the content of the fluorine-based liquid compound in the temporary adhesion film is preferably 0.9% by mass or less, more preferably 0.6% by mass, still more preferably 0.4% by mass, even still more preferably 0.3% by mass, even still more preferably 0.2% by mass or less, and particularly preferably 0.1% by mass or less with respect to the total solid content of the temporary adhesion film. In a case where two or more compounds are used in combination, it is preferable that the total content is in the above-described range. Particularly in the present invention, when the content of the fluorine-based liquid compound is set to be in a range of 0.001% to 0.1% by mass and preferably in a range of 0.001% to 0.09% by mass, floating of a wafer edge at the time of obtaining a laminate is effectively suppressed. Since the fluorine-based liquid compound is a compound which is unevenly distributed, the release properties can be sufficiently ensured even in a case where the amount of the fluorine-based liquid compound to be formulated is small.

It is preferable that the temporary adhesion film of the present invention contains a silicone compound. The lower limit of the content ratio of the silicone compound in the temporary adhesion film of the present invention is preferably 0.001% by mass or greater, more preferably 0.002% by mass or greater, still more preferably 0.01% by mass or greater, even still more preferably 0.03% by mass, particularly preferably 0.04% by mass, and more particularly preferably 0.05% by mass or greater with respect to the total solid content of the temporary adhesion film. The upper limit of the content of the silicone compound is preferably 1% by mass or less, more preferably 0.8% by mass or less, still more preferably 0.6% by mass or less, even still more preferably 0.4% by mass or less, even still more preferably 0.2% by mass or less, and even still more preferably 0.1% by mass or less with respect to the total solid content of the temporary adhesion film.

Particularly in the present invention, when the content of the silicone compound is set to be in a range of 0.001% to 0.1% by mass and preferably in a range of 0.001% to 0.09% by mass, floating of a wafer edge at the time of obtaining a laminate is effectively suppressed. The silicone compound is a compound which is unevenly distributed and the release properties can be sufficiently ensured even in a case where the amount of the silicone compound to be formulated is small.

The content of the fluorine-based liquid compound and the content of the silicone compound in the temporary adhesion film can be respectively measured by quantifying the amount of fluorine atom contained in the fluorine-based liquid compound according to an ion chromatographic method and quantifying the amount of silicon atoms contained in the silicone compound according to an ICP-AES method.

The temporary adhesion film of the present invention may contain other additives such as an antioxidant. The details thereof will be described below.

In the present invention, the temporary adhesion film may be formed of a single layer or two or more layers, but it is preferable that the temporary adhesion film is formed of a single layer.

The average film thickness of the temporary adhesion film according to the present invention is preferably in a range of 0.1 to 500 μm. The lower limit thereof is preferably 1 μm or greater. The upper limit thereof is preferably 200 μm or less and more preferably 100 μm or less. In a case where the temporary adhesion film has two or more layers, it is preferable that the total thickness is in the above-described range.

Next, the method of producing the temporary adhesion film will be described.

The temporary adhesion film may be formed on one surface of the first base material and the second base material or on a surface of a support other than the first base material and the second base material. Hereinafter, the method of producing the temporary adhesion film will be described with reference to an example of a case where the temporary adhesion film is formed on a surface of another support, but the method of producing the temporary adhesion film can be performed in the same-manner as in the case described above even in a case where the temporary adhesion film is formed on one surface of the first base material and the second base material.

It is preferable that the method of producing the temporary adhesion film includes step of producing a temporary adhesion film by forming a temporary adhesion composition on a surface of a support in the form of a layer and drying a solvent.

Examples of applying the temporary adhesion composition include a spin coating method, a blade coating method, a spray method, a roller coating method, a flow coating method, a doctor coating method, a screen printing method, and a dip coating method. Among these, a spin coating method and a blade coating method are preferable. Further, a method of extruding the temporary adhesion composition from a slit-like opening by applying a pressure and coating a support with the temporary adhesion composition may be used.

The coating amount of the temporary adhesion composition varies depending on the intended purpose thereof, but it is preferable that the coating amount thereof is set such that the average film thickness of the temporary adhesion film after being dried is set to be in a range of 0.1 to 500 μm. The lower limit thereof is preferably 1 μm or greater. The upper limit thereof is preferably 200 μm or less and more preferably 100 μm or less.

Further, in the present invention, the average film thickness of the temporary adhesion film is defined as an average value of the values obtained by measuring the film thickness at five places at equal intervals using a micrometer from one end surface toward the other end surface in the cross section along one direction of the temporary adhesion film. Further, in the present invention, the "cross section along one direction of the temporary adhesion film" is a cross section orthogonal to a long side direction in a case where the temporary adhesion film has a polygonal shape. Further, the "cross section along one direction of the temporary adhesion film" is a cross section orthogonal to any one side in a case where the temporary adhesion film has a square shape. Further, the "cross section along one direction of the temporary adhesion film" is a cross section passing through the center of gravity in a case where the temporary adhesion film has a circular shape or an elliptical shape.

The drying conditions vary depending on the type of the temporary adhesion composition or the film thickness of the temporary adhesion film. It is preferable that the drying is performed under a temperature condition of 60° C. to 220° C. for 10 to 600 seconds. The drying temperature is more preferably in a range of 80° C. to 200° C. The drying time is more preferably in a range of 30 to 500 seconds and still more preferably in a range of 40 to 400 seconds.

The drying may be performed by gradually increasing the temperature in two stages. For example, the temporary adhesion film is heated in a temperature range of 90° C. to 130° C. for 30 seconds to 250 seconds and then the temporary adhesion film is heated in a temperature range of 170° C. to 220° C. for 30 seconds to 250 seconds.

The type of the support forming the temporary adhesion film is not particularly limited, but a support having release properties is preferable from the viewpoint that the support is transferred to one of the first base material and the second base material.

In a case where the temporary adhesion film is formed on the support, the film-like temporary adhesion film may be a film formed of only a temporary adhesion film peeled from the support, a temporary adhesion film having a peeling sheet on one surface thereof, or a temporary adhesion film having peeling sheets on both surfaces thereof.

A roll-like long film can be obtained by continuously performing these treatments. The length of the long film is not particularly limited, but the lower limit thereof is preferably 5000 mm or greater and more preferably 1000 mm or greater. The upper limit thereof is preferably 500000 mm or less and more preferably 200000 mm or less. The peeling sheet is removed by being peeled off at the time of use.

In a case where the temporary adhesion film is formed on the support, it is preferable that the film-like temporary adhesion film is applied to one surface of the first base material and the second base material so as to be laminated on the surface by applying heat and a pressure.

Meanwhile, in a case where the first base material or the second base material is used in place of the support, it is possible to process a device wafer by allowing the temporary adhesion film to remain without peeling the temporary adhesion film off from these base material. The processing performed on the device wafer will be described below. Further, in a case where the temporary adhesion film is directly provided on the surface of a base material, it is preferable that a step of washing the excessive temporary adhesion film adhering to the rear surface of the base material or the outer peripheral portion of the base material is provided. At this time, it is preferable that the temporary adhesion film is washed with a solvent. Further, such a solvent is determined as appropriate in consideration of the relationship between the solvent and the composition of the temporary adhesion composition, and examples of the solvent include methylene.

Next, the temporary adhesion composition of the present invention will be described. The temporary adhesion composition of the present invention includes, sequentially being adjacent to each other, a first base material; a temporary adhesion film obtained by film formation using a temporary adhesion composition; and a second base material, in which a base material is peeled off by fixing any one of a first base material and a second base material of the laminate at 25° C. and pulling an end portion of the other base material up in a direction perpendicular to the surface of the other base material from an interface with the temporary adhesion film at a speed of 50 min/min, and the force applied during the pulling-up is measured using a force gauge and the value is 0.33 N/mm or less.

<Binder>

It is preferable that the temporary adhesion composition of the present invention contains at least one binder. In the present invention, the type or the like of the binder is not particularly limited as long as various characteristics of the temporary adhesion film can be achieved.

Examples of the binder include a block copolymer, a random copolymer, and a graft copolymer. Among these, a block copolymer is preferable. Since a block copolymer is capable of suppressing the flow of the temporary adhesion composition during the heating process, adhesion can be maintained even during the heating process and an effect that peeling properties are not changed even during the heating process can be expected.

The type of the binder is not particularly limited, and examples thereof include a polystyrene copolymer, a polyester copolymer, a polyolefin copolymer, a polyurethane copolymer, a polyamide copolymer, a polyacrylic copolymer, a silicone copolymer, and a polyimide copolymer. Particularly, a polystyrene copolymer, a polyester copolymer, and a polyamide copolymer are preferable and a polystyrene copolymer is more preferable from the viewpoints of heat resistance and peeling properties. Among these, as the binder, a block copolymer of styrene and another monomer is preferable and a styrene block copolymer in which one terminal or both terminals are formed of a styrene block is particularly preferable.

Further, a hydrogenated material of a block copolymer is preferable as the binder. In a case where the binder is a hydrogenated material, heat stability or storage stability is improved. Further, the peeling properties and washing and removing properties of the temporary adhesion film after being peeled off are improved. In addition, the hydrogenated material indicates a polymer having a structure in which a block copolymer is hydrogenated.

In the present invention, an elastomer is preferable as the binder. When an elastomer is used as the binder, fine unevenness of a carrier base material or a device wafer (the first base material or the second base material) can be followed and the temporary adhesion film having excellent adhesiveness can be formed using an appropriate anchor effect. The elastomer can be used alone or in combination of two or more kinds thereof.

Further, in the present specification, the elastomer indicates a polymer compound exhibiting elastic deformation. In other words, the elastomer is defined as a polymer compound which is immediately deformed due to an external force when the external force is applied and has a property of recovering the original shape in a short time when the external force is eliminated.

<<Elastomer>>

In the present invention, the weight-average molecular weight of the elastomer is preferably in a range of 2000 to 200000, more preferably in a range of 10000 to 200000, and still more preferably in a range of 50000 to 100000. When the weight-average molecular weight is in the above-described range, since the solubility of the elastomer in a solvent becomes excellent, residues are easily dissolved in a solvent and removed when residues derived from elastomers remaining in a device wafer or a carrier base material are removed using a solvent after the carrier base material is peeled off from the device wafer. Accordingly, there is an advantage that residues do not remain on the device wafer or the carrier base material.

In the present invention, the elastomer is not particularly limited, and examples thereof include an elastomer having a repeating unit derived from styrene (polystyrene-based elastomer), a polyester-based elastomer, a polyolefin-based elastomer, a polyurethane-based elastomer, a polyamide-based elastomer, a polyacrylic elastomer, a silicone-based elastomer, and a polyimide-based elastomer. Among these, a polystyrene-based elastomer, a polyester-based elastomer, and a polyamide-based elastomer are particularly preferable and a polystyrene-based elastomer is most preferable from the viewpoint of the heat resistance and peeling properties.

In the present invention, it is preferable that the elastomer is a hydrogenated matter. A hydrogenated matter of a polystyrene-based elastomer is particularly preferable. In a case where the elastomer is a hydrogenated matter, the heat stability or storage stability is improved. Further, the peeling properties and the washing and removing properties of the temporary adhesion film after being peeled off are improved. In a case where a hydrogenated material of a polystyrene-based elastomer is used, the above-described effects are significant. Further, the hydrogenated material indicates a polymer having a structure in which an elastomer is hydrogenated.

In the present invention, the 5% thermal mass reduction temperature of the elastomer when the temperature is raised at a temperature rising rate of 20° C./min from 25° C. is preferably 250° C. or higher, more preferably 300° C. or higher, still more preferably 350° C. or higher, and even still more preferably 400° C. or higher. Further, the upper limit is not particularly limited, but is preferably 1000° C. or lower and more preferably 800° C. or lower. According to this embodiment, a temporary adhesion film having excellent heat resistance is easily formed.

In a case where the original size of the elastomer used in the present invention is set to 100%, it is preferable that the elastomer can be deformed up to 200% by applying a small external force at room temperature (20° C.) and the elastomer has a property of returning to the original size by 130% or less in a short time when the external force is eliminated.

<<<Polystyrene-Based Elastomer>>>

The polystyrene-based elastomer is not particularly limited and can be selected as appropriate depending on the intended purpose. Examples thereof include a styrene-butadiene-styrene block copolymer (SBS), a styrene-isoprene-styrene block copolymer (SIS), a styrene-ethylene-butylene-styrene block copolymer (SEBS), a styrene-butadiene-butylene-styrene copolymer (SBBS), and hydrogenated materials of these, a styrene-ethylene-propylene-styrene block copolymer (SEPS), and a styrene-ethylene-ethylene-propylene-styrene block copolymer (SEEPS).

The content of the repeating unit derived from styrene in the polystyrene-based elastomer is preferably in a range of 10% to 90% by mass. From the viewpoint of peeling properties, the lower limit thereof is preferably 25% by mass or greater and more preferably 51% by mass or greater.

In the present invention, it is preferable that the polystyrene-based elastomer is used by combining an elastomer A containing repeating units derived from styrene at a proportion of 10% to 50% by mass of all repeating units and an elastomer B containing repeating units derived from styrene at a proportion of greater than 50% and 95% by mass or less of all repeating units. The occurrence of warpage can be effectively suppressed by combining the elastomer A and the elastomer B. The mechanism of obtaining such an effect can be assumed as follows.

In other words, since the elastomer A is formed of a relatively soft material, a temporary adhesion film having elasticity is easily formed. Accordingly, when a laminate of a base material and a support is produced using the temporary adhesion composition of the present invention and the base material is polished to obtain a thin film, the temporary adhesion film can be made to easily return to the original shape when elastically deformed even in a case where a pressure at the time of polishing is locally applied. As the result, excellent flat polishability can be obtained. Further, even in a case where the polished laminate is subjected to a heat treatment and then cooled, the internal stress generated at the time of cooling can be relaxed and the occurrence of warpage can be effectively suppressed by the temporary adhesion film.

In addition, since the elastomer B is a relatively hard material, a temporary adhesion film having excellent peeling properties can be produced when the temporary adhesion film contains the elastomer B.

The content of the repeating units derived from styrene in the elastomer A is preferably in a range of 13% to 45% by mass and more preferably in a range of 15% to 40% by mass based on all repeating units. According to the embodiment, more excellent flat polishability can be obtained. Further, the occurrence of warpage of the polished base material can be effectively suppressed.

The hardness of the elastomer A is preferably in a range of 20 to 82 and more preferably in a range of 60 to 79. Further, the hardness is a value measured using a type A durometer according to a method in conformity with JIS K 6253.

The content of the repeating units derived from styrene in the elastomer B is preferably in a range of 55% to 90% by mass and more preferably in a range of 60% to 80% by mass based on all repeating units. According to the embodiment, the peeling properties can be more effectively improved.

The hardness of the elastomer B is preferably in a range of 83 to 100 and more preferably in a range of 90 to 99.

The ratio of the mass of the elastomer A to the mass of the elastomer B (elastomer A:elastomer B) is preferably in a range of 5:95 to 95:5, more preferably in a range of 10:90 to 80:20, still more preferably in a range of 15:85 to 60:40, and most preferably in a range of 25:75 to 60:40. When the ratio is in the above-described range, the above-described effects can be more effectively obtained.

In a case where a process of heating a device wafer carried by the temporary adhesion film to 200° C. or higher is performed, the ratio of the mass of the elastomer A to the mass of the elastomer B (elastomer A:elastomer B) is preferably in a range of 1:99 to 99:1, more preferably in a range of 3:97 to 97:3, still more preferably in a range of 5:95 to 95:5, and most preferably in a range of 10:90 to 90:10. When the ratio is in the above-described range, the above-described effects can be more effectively obtained.

As the polystyrene-based elastomer, a block copolymer of styrene and another monomer is preferable, a block copolymer in which one terminal or both terminals are formed of a styrene block is more preferable, and a block copolymer in which both terminals are formed of a styrene block is particularly preferable. In a case where the both ends of the polystyrene-based elastomer are styrene blocks (repeating units derived from styrene), the heat resistance tends to be more improved. This is because repeating units derived from styrene having excellent heat resistance are present at the terminals. Particularly, it is preferable that the block portions having the repeating units derived from styrene are formed of a reactive polystyrene-based hard block from the viewpoint that the heat resistance and the chemical resistance are more excellent. It is considered that phase separation between hard blocks and soft blocks is performed at a temperature of 200° C. or higher in a case where these are block copolymers. It is considered that the shape of the phase separation contributes to suppression of occurrence of unevenness on the surface of the device wafer. In addition, such an elastomer is more preferable from the viewpoints of the solubility in a solvent and the resistance to a resist solvent.

Further, in a case where the polystyrene-based elastomer is a hydrogenated material, the stability with respect to heat is improved and deterioration such as decomposition or polymerization is unlikely to occur. Further, this is more preferable from the viewpoints of the solubility in a solvent and the resistance to a resist solvent.

From the viewpoint of the peeling properties, the amount of an unsaturated double bond of the polystyrene-based elastomer is preferably less than 15 mmol, more preferably less than 5 mmol, and most preferably less than 0.5 mmol per 1 g of the polystyrene-based elastomer. The amount of the unsaturated double bond here does not include an unsaturated double bond in a benzene ring derived from styrene. The amount of the unsaturated double bond can be calculated by nuclear magnetic resonance (NMR) measurement.

In addition, the "repeating unit derived from styrene" in the present specification is a constitutional unit derived from styrene contained in a polymer at the time of polymerizing styrene or a styrene derivative and may include a substituent. Examples of the styrene derivative include α-methylstyrene, 3-methylstyrene, 4-propylstyrene, and 4-cyclohexylstyrene. Examples of the substituent include an alkyl group having 1 to 5 carbon atoms, an alkoxy group having 1 to 5 carbon atoms, an alkoxyalkyl group having 1 to 5 carbon atoms, an acetoxy group, and a carboxyl group.

Examples of commercially available products of the polystyrene-based elastomer include TUFPRENE A, TUFPRENE 125, TUFPRENE 126S, SOLPRENE T, ASAPRENE T-411, ASAPRENE T-432 ASAPRENE 1-437, ASAPRENE 1-438, ASAPRENE T-439, TUFTEC H1272, TUFTEC P1500, TUFTEC H1052, TUFTEC H1062, TUFTEC M1943, TUFTEC M1911, TUFTEC H1041, TUFTEC MP10, TUFTEC M1913, TUFTEC H1051, TUFTEC H1053, TUFTEC P2000, and TUFTEC H1043 (all manufactured by Asahi Kasei Corporation), ELASTOMER AR-850C, ELASTOMER AR-815C, ELASTOMER AR-840C, ELASTOMER AR-830C, ELASTOMER AR-860C, ELASTOMER AR-875C, ELASTOMER AR-885C, ELASTOMER AR-SC-15, ELASTOMER AR- SC-0, ELASTOMER AR-SC-5, ELASTOMER AR-710, ELASTOMER AR-SC-65, ELASTOMER AR-SC-30, ELASTOMER AR-SC-75, ELASTOMER AR-SC-45, ELASTOMER AR-720, ELASTOMER AR-741, ELASTOMER AR-731, ELASTOMER AR-750, ELASTOMER AR-760, ELASTOMER AR-770, ELASTOMER AR-781, ELASTOMER AR-791, ELASTOMER AR-FL-75N, ELASTOMER AR-FL-85N, ELASTOMER AR-FL-60N, ELASTOMER AR-1050, ELASTOMER AR-1060, and ELASTOMER AR-1040 (all manufactured by ARONKASEI CO., LTD.), KRATON D1111, KRATON D1113, KRATON D1114, KRATON D1117, KRATON D1119, KRATON D1124, KRAFON D1126, KRATON D1161, KRATON D1162, KRATON D1163, KRATON D1164, KRATON D1165, KRATON D1183, KRATON D1193, KRATON DX406, KRATON D4141, KRATON D4150, KRATON D4153, KRATON D4158, KRATON D4270, KRATON D4271, KRATON D4433, KRATON D1170, KRATON D1171, KRATON D1173, CARIFLEX IR0307, CARIFLEX IR 0310, CARIFLEX IR 0401, KRATON D0242, KRATON D1101, KRATON D1102, KRATON D1116, KRATON D1118, KRATON D1133, KRATON D1152, KRATON D1153KRATON D1155, KRATON D1184KRATON D1186, KRATON D1189, KRATON D1191, KRATON D1192, KRAFON DX405, KRATON DX408, KRATON DX410, KRAFON DX414, KRATON DX415, KRATON A1535, KRATON A1536, KRATON FG1901, KRATON FG1924, KRATON G1640, KRATON G1641, KRATON G1642, KRATON G1643, KRATON G1645, KRAION G1633, KRATON G1650, KRATON G1651, KRATON G1652 (G1652 MU-1000), KRATON G1654, KRATON G1657, KRATON (G1660, KRATON G1726, KRATON (G1701, KRATON (G1702, KRATON G1730, KRATON G1750, KRATON G1765, KRATON (G4609, and KRATON G4610 (all manufactured by Kraton Corporation), TR2000, TR2001, TR2003, TR2250, TR2500, TR2601, TR2630, TR2787, TR2827, TR1086, TR1600, SIS5002, SIS5200, SIS5250, SIS5405, SIS5505, DYNARON 6100P, DYNARON 4600P, DYNARON 6200P, DYNARON 4630P, DYNARON 8601P, DYNARON 8630P, DYNARON 8600P, DYNARON 8903P, DYNARON 6201B, DYNARON 1321P, DYNARON 1320P, DYNARON 2324P, and DYNARON 9901P (all manufactured by JSR CORPORATION), denka STR series (manufactured by Denka Seiken Co., Ltd.), QUINTAC 3520, QUINTAC 3433N, QUINTAC 3421, QUINTAC 3620, QUINTAC 3450, and QUINTAC 3460 (all manufactured by ZEON CORPORATION), TPE-SB series (manufactured by Dainippon Sumitomo Phama Co., Ltd.), RABALON series (manufactured by Mitsubishi Chemical Corporation), SEPTON 1001, SEPTON 8004, SEPTON 4033, SEPTON 2104, SEPTON 8007, SEPTON 2007, SEPTON 2004, SEPTON 2063, SEPTON HG252, SEPTON 8076, SEPTON 2002, SEPTON 1020, SEPTON 8104, SEPTON 2005, SEPTON 2006, SEPTON 4055, SEPTON 4044, SEPTON 4077, SEPTON 4099, SEPTON 8006, SEPTON V9461, SEPTON V9475, SEPTON V9827, HYBRAR 7311, HYBRAR 7125, HYBRAR 5127, and HYBRAR 5125 (all manufactured by Kuraray Co., Ltd.), SUMIFLEX (manufactured by Sumitomo Bakelite Company Limited), LEOSTOMER, and ACTYMER (both manufactured by RIKEN TECHNOS CORP.).

<<<Polyester-Based Elastomer>>>

The polyester-based elastomer is not particularly limited and can be selected as appropriate depending on the intended purpose thereof. For example, elastomers obtained by polycondensing dicarboxylic acid or a derivative thereof and a diol compound or a derivative thereof may be exemplified.

Examples of the dicarboxylic acid include aromatic dicarboxylic acid such as terephthalic acid, isophthalic acid, or naphthalene dicarboxylic acid; aromatic dicarboxylic acid in which these hydrogen atoms of aromatic rings are substituted with a methyl group, an ethyl group, a phenyl group, and the like; aliphatic dicarboxylic acid having 2 to 20 carbon atoms such as adipic acid, sebacic acid, or dodecanedicarboxylic acid; and alicyclic dicarboxylic acid such as cyclohexanedicarboxylic acid. These may be used alone or in combination of two or more kinds thereof.

Examples of the diol compound include an aliphatic diol such as ethylene glycol, 1,3-propanediol, 1,4-butanediol, 1,6-hexanediol, 1,10-decanediol, or 1,4-cyclohexanediol, an alicyclic diol, and divalent phenol represented by the following structural formula.

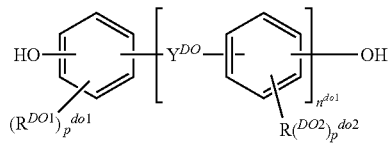

In the formula, $Y^{DO}$ represents any of an alkylene group having 1 to 10 carbon atoms, a cycloalkylene group having 4 to 8 carbon atoms, $-O-$, $-S-$, and $-SO_2-$ or a direct bond (single bond) between benzene rings. $R^{DO1}$ and $R^{DO2}$ each independently represent a halogen atom or an alkyl group having 1 to 12 carbon atoms. $p^{do1}$ and $p^{do2}$ each independently represent an integer of 0 to 4 and $n^{do1}$ represents 0 or 1.

Specific examples of the divalent phenol include bisphenol A, bis-(4-hydroxyphenyl)methane, bis-(4-hydroxy-3-methylphenyl)propane, and resorcin. There may be used alone or in combination of two or more kinds thereof.

Further, as the polyester-based elastomer, a multi-block copolymer obtained by forming an aromatic polyester portion (for example, polybutylene terephthalate) with a hard segment component and forming an aliphatic polyester portion (for example, polytetramethylene glycol) with a soft segment component can be used. Examples of the multi-block copolymer include those with various grades depending on the difference between the types, the proportions, and the molecular weights of the hard segment or the soft segment. Specific examples thereof include HYTREL (manufactured by DU PONT-TODAY CO., LTD.), PELPRENE (manufactured by TOYOBO CO., LTD.), PRIMALLOY (manufactured by Mitsubishi Chemical Corporation), NUBERAN (manufactured by TEIJIN LIMITED), and ESPEL 1612 and ESPEL 1620 (both manufactured by Hitachi Chemical Co., Ltd.).

<<<Polyolefin-Based Elastomer>>>

The polyolefin-based elastomer is not particularly limited and can be selected as appropriate depending on the intended purpose thereof. Examples thereof include a copolymer of α-olefin having 2 to 20 carbon atoms such as ethylene, propylene, 1-butene, 1-hexene, or 4-methyl-1-pentene. Examples of the copolymer include an ethylene-propylene copolymer (EPR), and an ethylene-propylene-diene copolymer (EPDM). Further, other examples thereof include a copolymer of non-conjugated diene and α-olefin having 2 to 20 carbon atoms such as dicyclopentadiene, 1,4-hexadiene, cyclooctadiene, methylene norborene, ethylidene norbornene, butadiene, or isoprene. Further, a carboxy-modified nitrile rubber obtained by copolymerizing methacrylic acid with a butadiene-acrylonitrile copolymer may be exemplified. Specific examples thereof include an ethylene-α-olefin copolymer rubber, an ethylene-α-olefin-non-conjugated diene copolymer rubber, a propylene-α-olefin copolymer rubber, and a butene-α-olefin copolymer rubber.

Examples of commercially available products thereof include MILASTOMER (manufactured by Mitsui Chemicals, Inc.), THERMORUN (manufactured by Mitsubishi Chemical Corporation), EXACT (manufactured by Exxon Chemical Company, Inc.), ENGAGE (manufactured by The Dow Chemical Company), ESPOLEX (manufactured by SUMITOMO CHEMICAL Co., Ltd.), Sarlink (manufactured by TOYOBO CO., LTD.), NEWCON (manufactured by Japan Polypropylene Corporation), and EXCELINK (manufactured by JSR Corporation).

<<<Polyurethane-Based Elastomer>>>

The polyurethane-based elastomer is not particularly limited and can be selected as appropriate depending on the intended purpose thereof. Examples thereof include elastomers which include a constitutional unit having a hard segment formed of low-molecular weight glycol and diisocyanate and a soft segment formed of a high-molecular weight (long chain) diol and diisocyanate.

Examples of the high-molecular weight (long chain) diol include polypropylene glycol, polytetramethylene oxide, poly(1,4-butyleneadipate), poly(ethylene-1,4-butyleneadipate), polycaprolactone, poly(1,6-hexylenecarbonate), and poly(1,6-hexylene-neopentyleneadipate). The number average molecular weight of the high-molecular weight (long chain) diol is preferably in a range of 500 to 10000.

As the low-molecular weight glycol, short chain diols such as ethylene glycol, propylene glycol, 1,4-butanediol, and bisphenol A can be used. The number average molecular weight of the short diol is preferably in a range of 48 to 500.

Examples of commercially available products of the polyurethane-based elastomer include PANDEX T-2185 and PANDEX T-2983N (both manufactured by DIC Corporation), MIRACTRAN (manufactured by Nippon Miractran Co., Ltd.), ELASTOLLAN (manufactured by BASF Japan. Ltd.), RESAMINE (manufactured by Dainichiseika Color & Chemicals Mfg. Co., Ltd.), PELLETHANE (manufactured by The Dow Chemical Company), IRONRUBBER (manufactured by NOK CORPORATION), and MOBILON (manufactured by Nisshinbo Chemical Inc.).

<<<Polyamide-Based Elastomer>>>

The polyamide-based elastomer is not particularly limited and can be selected as appropriate depending on the intended purpose thereof. Examples thereof include an elastomer obtained by using a polyimide such as polyamide-6, polyamide-11, or polyamide-12 for a hard segment and an elastomer obtained by using at least one of polyether or polyester such as polyoxyethylene, polyoxypropylene, or polytetramethylene glycol for a soft segment. These elastomers are largely divided into two types of a polyether block amide type and a polyether ester block amide type.

Examples of commercially available products thereof include UBE polyamide elastomer and UBESTA XPA (both manufactured by Ube Industries, Ltd.), DAIAMIDE (manufactured by Daicel-Evonik Ltd.), PEBAX (manufactured by ARKEMA Inc.), GRILON ELX (manufactured by EMS-CHEMIE Japan Ltd.), NOVAMID (manufactured by Mitsui Chemicals, Inc.), GRELAX (manufactured by TOYOBO CO., LTD.), polyether ester amide PA-200, PA-201, TPAE-12, TPAE-32, polyester amide TPAE-617, and TPAE-617C (all manufactured by T & K TOKA CO., LTD.).

<<<Polyacrylic Elastomer>>>

The polyacrylic elastomer is not particularly limited and can be selected as appropriate depending on the purpose thereof. Examples thereof include an elastomer having acrylic acid ester such as ethyl acrylate, butyl acrylate, methoxyethyl acrylate, or ethoxyethyl acrylate as a main component of a monomer material; and a copolymer obtained by copolymerizing acrylic acid ester and glycidyl methacrylate, allyl glycidyl ether, or the like. Further, other examples thereof include a copolymer obtained by copolymerizing acrylic acid ester and a cross-linking monomer such as acrylonitrile or ethylene. Specific examples thereof include an acrylonitrile-butyl acrylate copolymer, an acrylonitrile-butyl acrylate-ethyl acrylate copolymer, and an acrylonitrile-butyl acrylate-glycidyl methacrylate copolymer.

<<<Silicone-Based Elastomer>>>

The silicone-based elastomer is not particularly limited and can be selected as appropriate depending on the purpose thereof. Examples thereof include elastomers having organopolysiloxane as a main component, such as a polydimethylsiloxane-based elastomer, a polymethylphenylsiloxane elastomer, and a polydiphenylsiloxane elastomer. Specific examples of commercially available products thereof include KE series Shin-Etsu. Chemical Co., Ltd.), SE series, CY series, and SH series (all manufactured by Dow Corning Toray Co., Ltd.).

<<<Other Elastomers>>>

As other elastomers of the present invention, a rubber-modified epoxy resin (epoxy-based elastomer) can be used. The epoxy-based elastomer is obtained by modifying a part of or all epoxy groups of a bisphenol F type epoxy resin, a bisphenol A type epoxy resin, a salicylaldehyde type epoxy resin, a phenol novolak type epoxy resin, or a cresol novolak type epoxy resin with a both-terminal carboxylic acid-modified butadiene-acrylonitrile rubber, a terminal amino-modified silicone rubber, or the like.

<<Other Polymer Compounds>>

In the present invention, polymer compounds other than the above-described elastomers (also referred to as other polymer compounds) can be used as the binder. Other polymer compounds can be used alone or in combination of two or more kinds thereof.

Specific examples of other polymer compounds include a hydrocarbon resin, a novolak resin, a phenol resin, an epoxy resin, a melamine resin, a urea resin, an unsaturated polyester resin, an alkyd resin, a polyamide resin, a thermoplastic polyimide resin, a polyimide imide resin, a polybenzimidazole resin, a polybenzoxazole resin, a polyvinyl chloride resin, a polyvinyl acetate resin, a polyacetal resin, a polycarbonate resin, a polyphenylene ether resin, a polybutylene terephthalate resin, a polyethylene terephthalate resin, a polyphenylene sulfide resin, a polysulfone resin, a polyethersulfone resin, a polyarylate resin, and a polyether ether ketone resin. Among these, a hydrocarbon resin, a thermoplastic polyimide resin, and a polycarbonate resin are preferable and a hydrocarbon resin is more preferable.

In the present invention, a binder containing fluorine atoms described below can be used as a binder, but it is preferable that the temporary adhesion film does not substantially contain the binder containing fluorine atoms (hereinafter, also referred to as a fluorine-based binder). The expression "the temporary adhesion film does not substantially contain the fluorine-based binder" indicates that the content of the fluorine-based binder is preferably 0.1% by mass or less, more preferably 0.05% by mass or less, and still more preferably 0% by mass with respect to the total mass of the binder.

<<<Hydrocarbon Resin>>>

In the present invention, arbitrary resins can be used as the hydrocarbon resin.

The hydrocarbon resin indicates a resin basically formed of only carbon atoms and hydrogen atoms, but other atoms may be included in the side chain thereof as long as the basic skeleton is a hydrocarbon resin. In other words, the concept of the hydrocarbon resin of the present invention includes a case where functional groups other than a hydrocarbon group are directly bonded to the main chain of the hydrocarbon resin formed of only carbon atoms and hydrogen atoms such as an acrylic resin, a polyvinyl alcohol resin, a polyvinyl acetal resin, or a polyvinyl pyrrolidone resin. In this case, the content of a repeating unit formed by a hydrocarbon group being directly bonded to the main chain thereof is preferably 30% by mole or greater with respect to the all repeating units of the resin.

Examples of the hydrocarbon resin that satisfies the above-described conditions include a terpene resin, a terpene phenol resin, a modified terpene resin, a hydrogenated terpene resin, a hydrogenated terpene phenol resin, rosin, rosin ester, hydrogenated rosin, hydrogenated rosin ester, polymerized rosin, polymerized rosin ester, modified rosin, a rosin-modified phenol resin, an alkylphenol resin, an aliphatic petroleum resin, an aromatic petroleum resin, a hydrogenated petroleum resin, a modified petroleum resin, an alicyclic petroleum resin, a cumarone petroleum resin, an indene petroleum resin, a polystyrene-polyolefin copolymer, an olefin polymer (such as a methylpentene copolymer), and a cycloolefin polymer (such as a norborene copolymer, a dicyclopentadiene copolymer, or a tetracyclododecene copolymer).

Among these, as the hydrocarbon resin, a terpene resin, rosin, a petroleum resin, hydrogenated rosin, polymerized rosin, an olefin polymer, or a cycloolefin polymer is preferable, a terpene resin, rosin, an olefin polymer, or a cycloolefin polymer is more preferable, and a cycloolefin polymer is still more preferable.

Examples of the cycloolefin polymer include a norbornene-based copolymer, a polymer of a monocyclic olefin, a polymer of a cyclic conjugated diene, a vinyl alicyclic hydrocarbon polymer, and hydrides of these polymers. Preferred examples of the cycloolefin polymer include an addition (co)polymer having at least one repeating unit represented by Formula (II) and an addition (co)polymer formed by further having at least one repeating unit represented by Formula (I). In addition, other preferred examples of the cycloolefin polymer include a ring-opened (co)polymer having at least one cyclic repeating unit represented by Formula (III).

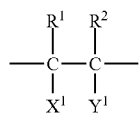
(I)

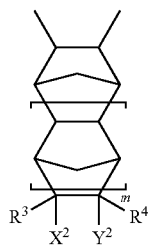
(II)

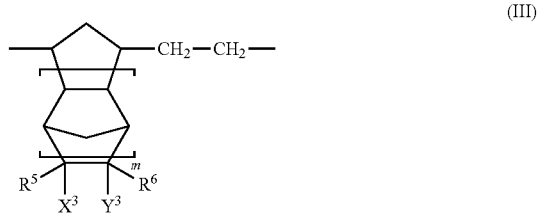
(III)

In the formulae, m represents an integer of 0 to 4. $R^1$ to $R^6$ each represent a hydrogen atom or a hydrocarbon group having 1 to 10 carbon atoms, $X^1$ to $X^3$ and $Y^1$ to $Y^3$ each represent a hydrogen atom, a hydrocarbon group having 1 to 10 carbon atoms, a halogen atom, a hydrocarbon group having 1 to 10 carbon atoms which is substituted with a halogen atom, —$(CH_2)nCOOR^{11}$, —$(CH_2)nOCOR^{12}$, —$(CH_2)nNCO$, —$(CH_2)nNO_2$, —$(CH_2)nCN$, —$(CH_2)nCONR^{13}R^{14}$, —$(CH_2)nNR^{15}R^{16}$, —$(CH_2)nOZ$, —$(CH_2)nW$, or (—$CO)_2O$ or (—$CO)_2NR^{17}$ configured of $X^1$ and $Y^1$, $X^2$ and $Y^2$, or $X^3$ and $Y^3$. $R^{11}$, $R^{12}$, $R^{13}$, $R^{14}$, $R^{15}$, $R^{16}$, and $R^{17}$ each represent a hydrogen atom or a hydrocarbon group (preferably a hydrocarbon group having 1 to 20 carbon atoms), Z represents a hydrocarbon group or a hydrocarbon group substituted with halogen, and W represents $SiR^{18}_pD_{3-p}$ ($R^{18}$ represents a hydrocarbon group having 1 to 10 carbon atoms, D represents a halogen atom, —$OCOR^8$, or —$OR^{18}$, and p represents an integer of 0 to 3). n represents an integer of 0 to 10.

The norborene-based polymer is disclosed in JP1998-7732A (JP-H10-7732A), JP2002-504184A, US2004/229157A1, and WO2004/070463A1. The norborene-based polymer can be obtained by performing addition polymerization on norborene-based polycyclic unsaturated compounds. Further, as necessary, a norborene-based polycyclic unsaturated compound, ethylene, propylene, or butene; a conjugated diene such as butadiene or isoprene; and a non-conjugated diene such as ethylidene norbornene can be subjected to addition polymerization. Such a norbornene-based polymer is commercially available under the product name of APEL (manufactured by Mitsui Chemicals, Inc.) and these products have various grades, for example, APL8008T (Tg of 70° C.), APL6013T (Tg of 125° C.), or APL6015T (Tg of 145° C.) with different glass transition temperatures (Tg). Further, Pellets such as TOPAS 8007, TOPAS 5013, TOPAS 6013, and TOPAS 6015 (manufactured by Polyplastics Co., Ltd.) are commercially available. As another example, Appear 3000 (manufactured by FILM Ferrania s.r.l) is commercially available.

As disclosed in JP1989-240517A (JP-H01-240517A), JP1995-196736A (JP-H07-196736A), JP1985-26024A (JP-S60-26024A), JP1987-19801A (JP-S62-19801A), JP2003-1159767A, and JP2004-309979A, a hydride of the norborene-based polymer can be produced by performing addition polymerization or metathesis ring opening polymerization on a polycyclic unsaturated compound and then hydrogenating the resultant.

In Formula (III), it is preferable that $R^5$ and $R^6$ represent a hydrogen atom or a methyl group and $X^3$ and $Y^3$ represent a hydrogen atom. Other groups are selected as appropriate. The norbornene-based polymer is commercially available under the product names of Arton G and Arton F (manufactured by JSR Corporation); and Zeonor ZF14, Zeonor ZF16, Zeonex 250, Zeonex 280, and Zeonex 480R (manufactured by Zeon Corporation), and these can be used.

<<<Thermoplastic Polyimide Resin>>>

As the thermoplastic polyimide resin, a tetracarboxylic dianhydride and a diamine can be subjected to a condensation reaction according to a known method and then used.

Examples of the known method include a method of performing dehydration ring closure on polyamic acid obtained by mixing the approximately equi-molar amounts of tetracarboxylic dianhydride and diamine in an organic solvent, and reacting the mixture at a reaction temperature of 80° C. or lower. Here, the approximately equi-molar amounts mean that the ratio between the molar amount of the tetracarboxylic dianhydride and the molar amount of the diamine is around 1:1. Further, as necessary, the compositional ratio between the tetracarboxylic dianhydride and the diamine may be adjusted such that the total amount of diamine to the total amount of 1.0 mol of tetracarboxylic dianhydride is in a range of 0.5 to 2.0 mol. When the compositional ratio between the tetracarboxylic dianhydride and the diamine is adjusted to be in the above-described range, the weight-average molecular weight of the thermoplastic polyimide resin can be adjusted.

The tetracarboxylic anhydride is not particularly limited, and examples thereof include pyromellitic dianhydride, 3,3',4,4'-biphenyltetracarboxylic dianhydride, 2,2',3,3'-biphenyltetracarboxylic dianhydride, 2,2-bis(3,4-dicarboxyphenyl)propane dianhydride, 2,2-bis(2,3-dicarboxyphenyl)propane dianhydride, 1,1-bis(2,3-dicarboxyphenyl)ethane dianhydride, 1,1-bis(3,4-diearboxyphenypethane dianhydride, bis(2,3-dicarboxyphenyl)methane dianhydride, bis(3,4-dicarboxyphenyl)methane dianhydride, bis(3,4-dicarboxyphenyl)sulfone dianhydride, 3,4,9,10-perylenetetracarboxylic dianhydride, bis(3,4-dicarboxyphenyl) ether dianhydride, benzene-1,2,3,4-tetracarboxylic dianhydride, 3,4,3',4'-benzophenonetetracarboxylic dianhydride, 2,3,2',3'-benzophenonetetracarboxylic dianhydride, 2,3,3'4'-benzophenonetetracarboxylic dianhydride, 1,2,5,6-naphthalenetetracarboxylic dianhydride, 1,4,5,8-naphthalenetetracarboxylic dianhydride, 2,3,6,7-naphthalenetetracarboxylic dianhydride. 1,2,4,5-naphthalenetetracarboxylic dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, phenanthrene-1,8,9,10-tetracarboxylic dianhydride, pyrazine-2,3,5,6-tetracarboxylic dianhydride, thiophene-2,3,5,6-tetracarboxylic dianhydride, 2,3,3'4'-biphenyltetracarboxylic dianhydride, 3,4,3',4'-biphenyltetracarboxylic dianhydride, 2,3,2',3'-biphenyltetracarboxylic dianhydride, bis(3,4-dicarboxyphenyl)dimethylsilane dianhydride, bis(3,4-dicarboxyphenyl)methylphenylsilane dianhydride, bis(3,4-dicarboxyphenyl)diphenylsilane dianhydride, 1,4-bis(3,4-dicarboxyphenyldimethylsilyl)benzene dianhydride, 1,3-bis(3,4-dicarboxyphenyl)-1,1,3,3-tetramethyldicyclohexane dianhydride, p-phenylenebis(trimellitate anhydride), ethylene tetracarboxylic dianhydride, 1,2,3,4-butanetetracarboxylic dianhydride, decahydronaphthalene-1,4,5,8-tetracarboxylic dianhydride, 4,8-dimethyl-1,2,3,5,6,7hexahydronaphthalene-1,2,5,6-tetracarboxylic dianhydride, cyclopentane-1,2,3,4-tetracarboxylic dianhydride, pyrrolidine-2,3,4,5-tetracarboxylic dianhydride, 1,2,3,4-cyclobutanetetracarboxylic dianhydride, bis(exo-bicyclo[2,2,1]heptane-2,3-dicarboxylic dianhydride), bicyclo-[2,2,2]-oct-7-ene-2,3,5,6-tetracarboxylic dianhydride, 2,2-bis(3,4-dicarboxyphenyl)propane dianhydride, 2,2-bis[4-(3,4-dicarboxyphenyl)phenyl]propane dianhydride, 2,2-bis(3,4-dicarboxyphenyl)hexafluoropropane dianhydride, 2,2bis[4-(3,4-dicarboxyphenyl)phenyl] hexafluoropropane dianhydride, 4,4'-bis(3,4-dicarboxyphenoxy)diphenylsulfide dianhydride, 1,4-bis(2-hydroxyhexafluoroisopropyl)benzenebis(trimellitate dianhydride), 1,3-bis(2-hydroxyhexafluoroisopropyl)benzenebis(trimellitate dianhydride), 5-(2,5-dioxotetrahydrofuryl)-3-methyl-3-cyclohexene-1,2-dicarboxylic dianhydride, tetrahydrofuran-2,3,4,5-tetracarboxylic dianhydride, 4,4'-oxydiphthalic dianhydride, 1,2-(ethylene)bis(trimellitate anhydride), 1,3-(trimethylene)bis(trimellitate anhydride), 1,4-(tetramethylene)bis(trimellitate anhydride), 1,5-(pentamethylene)bis(trimellitate anhydride), 1,6-(hexamethylene)bis(trimellitate anhydride), 1,7-(heptamethylene)bis(trimellitate anhydride), 1,8-(octamethylene)bis(trimellitate anhydride), 1,9-(nonamethylene)bis(trimellitate anhydride), 1,10-(decamethylene)bis(trimellitate anhydride), 1,12-(dodecamethylene)bis(trimellitate anhydride), 1,16-(hexadecamethylene)bis(trimellitate anhydride), and 1,18-(octadecamethylene)bis(trimellitate anhydride). These may be used alone or in combination of two or more kinds thereof. Among these, 3,4,3',4'-benzophenonetetracarboxylic dianhydride, 2,3,2',3'-benzophenonetetracarboxylic dianhydride, and 2,3,3',4'-benzophenonetctracarboxylic dianhydride are preferable and 3,4,3',4'-benzophenonetetracarboxylic dianhydride is more preferable.

The diamine is not particularly limited and examples thereof include aromatic diamines such as o-phenylenediamine, m-phenylenediamine, p-phenylenediamine 3,3-diaminodiphenyl ether, 3,4'-diaminodiphenyl ether, 4,4'-diaminodiphenyl ether, 3,3'-diaminodiphenylmethane, 3,4'-diaminodiphenylmethane, bis(4-amino-3,5-dimethylphenyl)methane, bis(4-amino-3,5-diisopropylphenyl)methane, 3,3'-diaminodiphenyldifiuoromethane, 3,4'-diaminodiphenyldifluoromethane, 4,4'-diaminodiphenyldifluoromethane, 3,3'-diaminodiphenylsulfone, 3,4'-di aminodiphenyl sulfone, 4,4'-diaminodiphenyl sulfone, 3,3'-diaminodiphenylsulfide, 3,4'-diaminodiphenyl sulfide, 4,4'-diaminodiphenyl sulfide, 3,3'-diaminodiphenyl ketone, 3,4'-diaminodiphenyl ketone, 4,4'-diaminodiphenyl ketone, 3-(4-aminophenyl)-1,1,3-trimethyl-5-aminoindan, 2,2-bis(3-aminophenyl)propane, 2,2'-(3,4'-diaminodiphenyl)propane, 2,2-bis(4-aminophenyl)propane, 2,2-bis(3-aminophenyl)hexafluoropropane, 2,2-(3,4'-diaminodiphenyl)hexafluoropropane, 2,2-bis(4-aminophenyl)hexafluoropropane, 1,3-bis(3-aminophenoxy)benzene, 1,4-bis(3-aminophenoxy)benzene, 1,4-bis(4-aminophenoxy)benzene, 3,3-(1,4-phenylenebis(1-methylethylidene))bisaniline, 3,4'-(1,4-phenylenebis(1-methylethylidene))bisaniline, 4,4'-(1,4-phenylenebis(1-methyl ethylidene))bisaniline, 2,2-bis(4-(3-aminophenoxy)phenyl)propane, 2,2-bis(4-(3-aminophenoxy)phenyl) hexafluoropropane, 2,2-bis(4-(4-aminophenoxy)phenyl) hexafluoropropane, bis(4-(3-aminophenoxy)phenyl)sulfide, bis(4-(4-aminophenoxy)phenyl)sulfide, bis(4-(3-aminophenoxy)phenyl)sulfone, bis(4-(4-aminophenoxy)phenyl)sulfone, 3,3'-dihydroxy-4,4'-diaminobiphenyl, and 3,5-diaminobenzoic acid, 1,3-bis(aminomethyl)cyclohexane, 2,2-bis(4-aminophenoxyphenyl)propane, polyoxypropylenediamine, 4,9-dioxadodecane-1,12-diamine, 4,9,14-trioxaheptadecane-1,17-diamine, 1,2-diaminoethane, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane, 1,2-diaminocyclohexane, and 1,3-bis(3-aminopropyl)tetramethyldisiloxane.

Among these, at least one selected from the group consisting of 3-(4-aminophenyl)-1,1,3-trim ethyl-5-aminoindan, 1,3-bis(3-aminopropyl)tetramethyldisiloxane, polyoxypropylenediamine, 2,2-bis(4-aminophenoxyphenyl)propane, 4,9-dioxadecane-1,12-diamine, 1,6-diaminohexane, and 4,9,14-trioxaheptadecane-1,17-diamine is preferable and 3-(4-aminophenyl)-1,1,3-trimethyl-5-aminoindane is more preferable.

Examples of the solvent used to react the tetracarboxylic dianhydride and the diamine include N,N-dimethylacetamide, N-methyl-2-pyrrolidone, and N,N-dimethylformamide. In order to adjust the solubility of raw materials or the like, a non-polar solvent (for example, toluene or xylene) may be used together.

The reaction temperature of the tetracarboxylic dianhydride and the diamine is preferably lower than 100° C. and more preferably lower than 90° C. Further, imidization of polyamic acid is typically carried out by performing a heat treatment in an inert atmosphere (typically, in a vacuum or in a nitrogen atmosphere). The temperature of the heat treatment is preferably 150° C. or higher and more preferably in a range of 180° C. to 450° C.

The weight-average molecular weight (Mw) of the thermoplastic polyimide resin is preferably in a range of 10000 to 1000000 and more preferably in a range of 20000 to 100000.

In the present invention, as the thermoplastic polyimide resin, a polyimide resin whose solubility in at least one solvent selected from γ-butyrolactone, cyclopentanone, N-methylpyrrolidone, N-ethyl-2-pyrrolidone, cyclohexanone, glycol ether, dimethyl sulfoxide, and tetramethylurea at 25° C. is 10 g/100 g solvent or greater is preferable.

As the thermoplastic polyimide resin having such a solubility, a thermoplastic polyimide resin obtained by reacting 3,4,3',4'-benzophenonetetracarboxylic dianhydride and 3-(4-aminophenyl)-1,1,3-trimethyl-5-aminoindan may be exemplified. This thermoplastic polyimide resin has particularly excellent heat resistance.

As the thermoplastic polyimide resin, commercially available products may be used. For example, Durimide (registered trademark) 200, Durimide 208A, and Durimide 284 (all manufactured by Fujifilm Corporation), GPT-LT (manufactured by Gun Ei Chemical Industry Co., Ltd.), SOXR-S, SOXR-M, SOXR-U, and SOXR-C (manufactured by Nippon Kodoshi Corporation), VH1003F, VH1003M, and XH1015 (all manufactured by Saudi Basic Industries Corporation).

<<<Polycarbonate Resin>>>

In the present invention, it is preferable that the polycarbonate resin has a repeating unit represented by Formula (I).

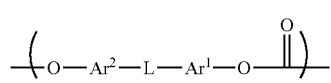

(1)

In Formula (1), $Ar^1$ and $Ar^2$ each independently represent an aromatic group and L represents a single bond or a divalent linking group.

$Ar^1$ and $Ar^2$ in Formula (1) each independently represent an aromatic group. Examples of the aromatic group include a benzene ring, a naphthalene ring, a pentalene ring, an indene ring, an azulene ring, a heptalene ring, an indecene ring, a perylene ring, a pentacene ring, an acenaphthene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxaline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, and a phenazine ring. Among these, a benzene ring is preferable.

These aromatic groups may include a substituent, but it is preferable that these aromatic groups do not include a substituent.

Examples of the substituent which an aromatic group may have include a halogen atom, an alkyl group, an alkoxy group, and an aryl group.

Examples of the halogen atom include a fluorine atom, a chlorine atom, a bromine atom, and an iodine atom.

As the alkyl group, an alkyl group having 1 to 30 carbon atoms may be exemplified. The number of carbon atoms of the alkyl group is more preferably in a range of 1 to 20 and still more preferably in a range of 1 to 10. The alkyl group may be linear or branched. Further, a part or all hydrogen atoms of the alkyl group may be substituted with halogen atoms. Examples of the halogen atoms include a fluorine atom, a chlorine atom, a bromine atom, and an iodine atom. Among these, a fluorine atom is preferable.

As the alkoxy group, an alkoxy group having 1 to 30 carbon atoms is preferable. The number of carbon atoms of the alkoxy group is more preferably in a range of 1 to 20 and still more preferably in a range of 1 to 10. The alkoxy group may be linear, branched, or cyclic.

As the aryl group, an aryl group having 6 to 30 carbon atoms is preferable and an aryl group having 6 to 20 carbon atoms is more preferable.

The weight-average molecular weight (Mw) of the polycarbonate resin is preferably in a range of 1000 to 1000000 and more preferably in a range of 10000 to 80000. When the weight-average molecular weight thereof is in the above-described range, the solubility in a solvent and the heat resistance are excellent.

Examples of commercially available products of the polycarbonate resin include PCZ-200, PCZ-300, PCZ-500, and PCZ-800 (all manufactured by Mitsubishi Gas Chemical Company), APEC9379 (manufactured by BAYER AG), and Panlite 1,12251-M (manufactured by TEIJIN LIMITED).

In the temporary adhesion composition of the present invention, the proportion of the binder is preferably in a range of 50.00% to 99.99% by mass, more preferably in a range of 70.00% to 99.99% by mass, and particularly preferably in a range of 88.00% to 99.99% by mass with respect to the total solid content in the temporary adhesion composition. When the content of the binder is in the above-described range, the adhesiveness and the peeling properties are excellent.

In a case where an elastomer is used as the binder, the proportion of the elastomer is preferably in a range of 50.00% to 99.99% by mass, more preferably in a range of 70.00% to 99.99% by mass, and particularly preferably in a range of 88.00% to 99.99% by mass with respect to the total solid content in the temporary adhesion composition. When the content of the elastomer is in the above-described range, the adhesiveness and the peeling properties are excellent. In a case where two or more kinds of elastomers are used, it is preferable that the total content thereof is in the above-described range.

Further, in a case where an elastomer is used as the binder, the content of the elastomer is preferably in a range of 50% to 100% by mass, more preferably in a range of 70% to 100% by mass, still more preferably in a range of 80% to 100% by mass, and even still more preferably in a range of 90% to 100% by mass with respect to the total mass of the binder. In addition, the binder may be substantially formed of only an elastomer. Further, when the binder is substantially formed of only an elastomer, the content of the elastomer is preferably 99% by mass or greater and more preferably 99.9% by mass or greater with respect to the total mass of the binder. Further, it is still more preferable that the binder is formed of only an elastomer.

<<Fluorine-Based Liquid Compound>>

It is preferable that the temporary adhesion composition of the present invention contains a fluorine-based liquid compound.

In the present invention, a liquid compound means that the compound has fluidity at 25° C. and the viscosity of the compound at 25° C. is in a range of 1 to 100000 Pa·s. Here, the viscosity can be measured using a B type viscometer. Further, as the method of measuring the viscosity, a value obtained by measuring the viscosity using a B type viscometer (Viscolead Advance, manufactured by Fungilab) is used.

The viscosity of the fluorine-based liquid compound at 25° C. is more preferably in a range of 10 to 20000 Pa·s and still more preferably in a range of 100 to 15000 Pa·s. When the viscosity of the fluorine-based liquid compound is in the above-described range, the fluorine-based liquid compound is easily unevenly distributed in the surface layer of the temporary adhesion film.

In the present invention, the fluorine-based liquid compound can be preferably used even in a case where the compound is in the form of an oligomer or a polymer. Further, the compound may be a mixture of an oligomer and a polymer. Such a mixture may further contain a monomer. In addition, the fluorine-based liquid compound may be a monomer.

From the viewpoint of heat resistance or the like, it is preferable that the fluorine-based liquid compound is an oligomer, a polymer, or a mixture of these.

Examples of the oligomer and the polymer include a radical polymer, a cationic polymer, and an anionic polymer, and all of these are preferably used. A vinyl polymer is particularly preferable.

The weight-average molecular weight of the fluorine-based liquid compound is preferably in a range of 500 to 100000, more preferably in a range of 1000 to 50000, and still more preferably in a range of 2000 to 20000.

In the present invention, a compound which is not modified at the time of the treatment performed on a base material provided for temporary adhesion is preferable as the fluorine-based liquid compound. For example, a compound which can be present in a state of a liquid even after the base material has been heated at 250° C. or higher and treated with various liquid chemicals is preferable. As a specific example, the viscosity of the fluorine-based liquid compound at 25° C. after being heated to 250° C. at a temperature rising rate of 10° C./min from 25° C. and then being cooled to 25° is preferably in a range of 1 to 100000 Pa·s, more preferably in a range of 10 to 20000 Pa·s, and still more preferably in a range of 100 to 15000 Pa·s.

As the fluorine-based liquid compound having such characteristics, a non-thermosetting compound which does not contain a reactive group is preferable. The reactive group here indicates all groups that react when heated at 250° C., and examples thereof include a polymerizable group and a hydrolyzable group. Specific examples thereof include a meth(acryl) group, an epoxy group, and an isocyanato group.

Further, the 10% thermal mass reduction temperature of the fluorine-based liquid compound when the temperature is raised at a temperature rising rate of 20° C./min from 25° C. is preferably 250° C. or higher and more preferably 280° C. or higher. Further, the upper limit is not particularly limited, but is preferably 1000° C. or lower and more preferably 800° C. or lower. According to this embodiment, a temporary adhesion film having excellent heat resistance is easily formed. The mass reduction temperature is a value obtained by performing measurement using a thermogravimetric analyzer (TGA) under the above-described condition of raising the temperature in a nitrogen stream.

The fluorine-based liquid compound used in the present invention contains a lipophilic group. Examples of the lipophilic group include a linear or branched alkyl group, a cycloalkyl group, and an aromatic group.

The number of carbon atoms of the alkyl group is preferably in a range of 2 to 30, more preferably in a range of 4 to 30, still more preferably in a range of 6 to 30, and particularly preferably in a range of 12 to 20. Specific examples of the alkyl group include a methyl group, an ethyl group, a propyl group, a butyl group, a pentyl group, a hexyl group, a heptyl group, an octyl group, a nonyl group, a decyl group, a dodecyl group, a tetradecyl group, an octadecyl group, an isopropyl group, an isobutyl group, a sec-butyl group, a tert-butyl group, a 1-ethylpentyl group, and a 2-ethylhexyl group.

The alkyl group may include a substituent. Examples of the substituent include a halogen atom, an alkoxy group, and an aromatic group.

Examples of the halogen atom include a chlorine atom, a fluorine atom, a bromine atom, and an iodine atom. Among these, a fluorine atom is preferable.

The number of carbon atoms of the alkoxy group is preferably in a range of 1 to 30, more preferably in a range of 1 to 20, and still more preferably in a range of 1 to 10. It is preferable that the alkoxy group is linear or branched.

The aromatic group may be monocyclic or polycyclic. The number of carbon atoms of the aromatic group is preferably in a range of 6 to 20, more preferably in a range of 6 to 14, and most preferably in a range of 6 to 10.

The cycloalkyl group may be monocyclic or polycyclic. The number of carbon atoms of the cycloalkyl group is preferably in a range of 3 to 30, more preferably in a range of 4 to 30, still more preferably in a range of 6 to 30, and most preferably in a range of 12 to 20. Examples of the monocyclic cycloalkyl group include a cyclopropyl group, a cyclobutyl group, a cyclopentyl group, a cyclohexyl group, a cycloheptyl group, and a cyclooctyl group. Examples of the polycyclic cycloalkyl group include an adamantly group, a norbornyl group, a bornyl group, a camphenyl group, a decahydronaphthyl group, a tricyclodecanyl group, a tetracyclodecanyl group, a camphoroyl group, a dicyclohexyl group, and a pinenyl group.

The cycloalkyl group may include the above-described substituent.

The aromatic group may be monocyclic or polycyclic. The number of carbon atoms of the aromatic group is preferably in a range of 6 to 20, more preferably in a range of 6 to 14, and most preferably in a range of 6 to 10. It is preferable that an element constituting a ring of the aromatic group does not contain heteroatoms (such as a nitrogen atom, an oxygen atom, and a sulfur atom). Specific examples of the aromatic group include a benzene ring, a naphthalene ring, a pentalene ring, an indene ring, an azulene ring, a heptalene ring an indecene ring, a perylene ring, a pentacene ring, an acenaphthene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxaline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, and a phenazine ring.

These aromatic groups may include a substituent.

The fluorine-based liquid compound may contain only one or two or more lipophilic groups. Further, the lipophilic group may contain fluorine atoms. That is, the fluorine-based liquid compound of the present invention may be a compound in which only the lipophilic group contains fluorine atoms. In addition, the fluorine-based liquid compound may be a compound that further contains a group having fluorine atoms (also referred to as a fluorine group) in addition to the lipophilic group. It is preferable that the fluorine-based liquid compound is a compound containing a lipophilic group and a fluorine group. In a case where the fluorine-based liquid compound is a compound having a lipophilic group and a fluorine group, the lipophilic group may or may not contain fluorine atoms, but it is preferable that the lipophilic group does not contain fluorine atoms.

The fluorine-based liquid compound contains one or more lipophilic groups in a molecule, and the number of lipophilic groups in a molecule is preferably in a range of 2 to 100 and particularly preferably in a range of 6 to 80.

As the fluorine group, a known fluorine group can be used. Examples of the known fluorine group include a fluorine-containing alkyl group and a fluorine; containing alkylene group. Among these fluorine groups, fluorine groups functioning as a lipophilic group are considered to be as lipophilic groups.

The number of carbon atoms of the fluorine-containing alkyl group is preferably in a range of 1 to 30, more preferably in a range of 1 to 20, and still more preferably in a range of 1 to 15. The fluorine-containing alkyl group may be linear, branched, or cyclic. Further, the fluorine-containing alkyl group may include an ether bond. Further, the fluorine-containing alkyl group may be a perfluoroalkyl group in which all hydrogen atoms are substituted with fluorine atoms.

The number of carbon atoms of the fluorine-containing alkylene group is preferably in a range of 2 to 30, more preferably in a range of 2 to 20, and still more preferably in a range of 2 to 15. The fluorine-containing alkylene group may be linear, branched, or cyclic. Further, the fluorine-containing alkylene group may include an ether bond. Further, the fluorine-containing alkylene group may be a perfluoroalkylene group in which all hydrogen atoms are substituted with fluorine atoms.

The content of the fluorine atoms in the fluorine-based liquid compound is preferably in a range of 1% to 90% by mass, more preferably in a range of 2% to 80% by mass, and still more preferably in a range of 5% to 70% by mass. When the content of the fluorine atoms is in the above-described range, the peeling properties are excellent.

The content of the fluorine atoms is defined by an inequation of "{(number of fluorine atoms in one molecule×mass of fluorine atoms)/mass of all atoms in one molecule}×100".

As the fluorine-based liquid compound, commercially available products can be used. Examples thereof include MEGAFACE series, for example, F-251, F-281, F-477, F-553, F-554, F-555, F-556, F-557, F-558, F-559, F-560, F-561, F-563, F-565, F-567, F-568, F-571, R-40, R-41, R-43, and R-94 (all manufactured by DIC Corporation) and FTERGENT series, for example, 710F, 710FM, 710FS, 730FL, and 730LM (all manufactured by NEOS COMPANY).

The content of the fluorine-based liquid compound in the temporary adhesion composition of the present invention is preferably 0.001% by mass or greater, more preferably 0.002% by mass or greater, still more preferably 0.01% by mass or greater, even still more preferably 0.03% by mass or greater, particularly preferably 0.04% by mass or greater, and more particularly preferably 0.05% by mass or greater with respect to the mass of the temporary adhesion composition from which a solvent is removed. The upper limit of the content of the fluorine-based liquid compound is preferably 1% by mass or less, more preferably 0.8% by mass or less, still more preferably 0.6% by mass or less, even still more preferably 0.4% by mass or less, even still more preferably 0.2% by mass or less, and even still more preferably 0.1% by mass or less with respect to the mass of the temporary adhesion composition from which a solvent is removed.

Particularly in the present invention, when the content of the fluorine-based liquid compound is set to be in a range of 0.001% to 0.1% by mass and preferably in a range of 0.001% to 0.09% by mass, floating of a wafer edge at the time of obtaining a laminate is effectively suppressed. Since the fluorine-based liquid compound is a compound which is unevenly distributed, the release properties can be sufficiently ensured even in a case where the amount of the fluorine-based liquid compound to be formulated is small. In a case where two or more kinds of the compounds are used in combination, it is preferable that the total content thereof is in the above-described range.

In the temporary adhesion composition of the present invention, the ratio of the mass of the fluorine-based liquid compound to the mass of the hinder (fluorine-based liquid compound:binder) is preferably in a range of 0.001:99.999 to 10:90.00, more preferably in a range of 0.001:99.999 to 5:95.00, and still more preferably in a range of 0.010:99.99 to 5:95.00. In a case where the ratio of the mass of the fluorine-based liquid compound to the mass of the binder is in the above-described range, a large amount of the fluorine-based liquid compound is more likely to be unevenly distributed to the air interface side of the temporary adhesion film.

<<Silicone Compound>>

It is preferable that the temporary adhesion composition of the present invention contains a silicone compound.

In the present invention, the silicone compound can be preferably used even in a case where the compound is in the form of an oligomer or a polymer. Further, the compound may be a mixture of an oligomer and a polymer.

The weight-average molecular weight of the silicone compound is preferably in a range of 500 to 100000, more preferably in a range of 1000 to 50000, and still more preferably in a range of 2000 to 40000.

In the present invention, the 10% thermal mass reduction temperature of the silicone compound when the temperature is raised at a temperature rising rate of 20° C./min from 25° C. is preferably 250° C. or higher and more preferably 280° C. or higher. Further, the upper limit is not particularly limited, but is preferably 1000° C. or lower and more preferably 800° C. or lower. According to this embodiment, a temporary adhesion film having excellent heat resistance is easily formed. The mass reduction temperature is a value obtained by performing measurement using a thermogravimetric analyzer (TGA) under the above-described condition of raising the temperature in a nitrogen stream.

It is preferable that the silicone compound used in the present invention is a modified silicone compound. Examples of the type of modification include reactive functional group modification such as monoamine modification, diamine modification, amino modification, epoxy modification, alicyclic epoxy modification, carbinol modification, mercapto modification, carboxyl modification, hydrogen modification, amino-polyether modification, epoxy-polyether modification, or epoxy-aralkyl modification; and non-reactive functional group modification such as polyether modification, aralkyl modification, chloroalkyl modification, long chain alkyl modification, higher fatty acid ester modification, higher fatty acid amide modification, or polyether-long chain alkyl-aralkyl modification.

The molecular weight of the polyether-modified silicone used in the present invention is preferably 500 or greater. Further, as the polyether-modified silicone, polyether-modified silicone containing at least one selected from ethylene oxide (EO) and propylene oxide (PO) is preferably used as a hydrophilic group and polyether-modified silicone containing ethylene oxide is more preferable.

In the present invention, polyether-modified silicone represented by any of Formulae (101) to (104) is particularly preferable.

In Formula (101), $R^{11}$ and $R^{16}$ each independently represent a substituent, $R^{12}$ and $R^{14}$ each independently represent a divalent linking group, $R^{13}$ and $R^{15}$ represent a hydrogen atom or an alkyl group having 1 to 5 carbon atoms, m11, m12, n1, and p1 each independently represent an integer of 0 to 20, and x1 and y1 each independently represent an integer of 2 to 100.

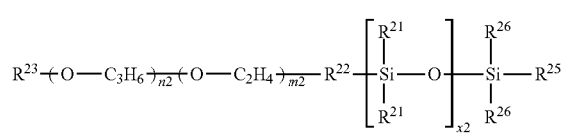

Formula (102)

In Formula (102), $R^{21}$, $R^{25}$, and $R^{26}$ each independently represent a substituent, $R^{22}$ represents a divalent linking group, $R^{23}$ represents a hydrogen atom or an alkyl group having 1 to 5 carbon atoms, m2 and n2 each independently represent an integer of 0 to 20, and x2 represents an integer of 2 to 100.

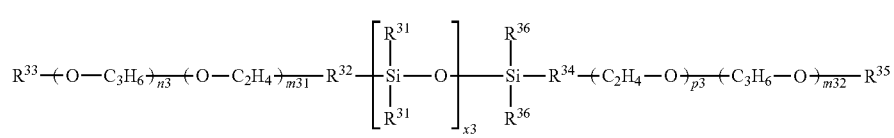

Formula (103)

In Formula (103), $R^{31}$ and $R^{36}$ each independently represent a substituent, $R^{32}$ and $R^{34}$ each independently represent a divalent linking group, $R^{33}$ and $R^{35}$ represent a hydrogen atom or an alkyl group having 1 to 5 carbon atoms, m31, m32, n3, and p3 each independently represent an integer of 0 to 20, and x3 represents an integer of 2 to 100.

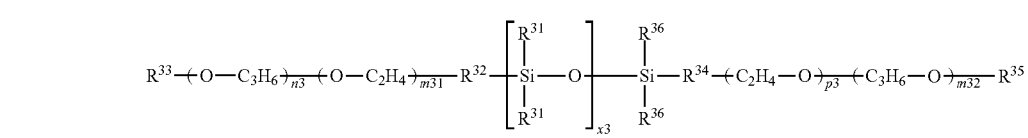

Formula (104)

In Formula (104), $R^{41}$, $R^{42}$, $R^{43}$, $R^{44}$, $R^{45}$, and $R^{46}$ each independently represent a substituent, $R^{47}$ represents a divalent linking group, $R^{48}$ represents a hydrogen atom or an alkyl group having 1 to 5 carbon atoms, m4 and n4 each independently represent an integer of 0 to 20, and x4 and y4 each independently represent an integer of 2 to 100.

In the polyether-modified silicone used in the present invention, the content of the polyoxyalkylene group in a molecule is not particularly limited, but it is desirable that the content of the polyoxyalkylene group is greater than 20% by mass based on the total molecular weight.

The content of the polyoxyalkylene group is defined by an inequation of "{(formula weight of polyoxyalkylene group in one molecule)/molecular weight of one molecule}/×100".

As the polyether-modified silicone used in the present invention, commercially available products can be used. Examples thereof include ADVALON FA33, FLUID L03, FLUID L033, FLUID L051, FLUID L053, FLUID L060, FLUID L066, 1M22, and WACKFR-Belsil DMC 6038 (all manufactured by Asahikasei Silicone Co., Ltd.), KF-352A, KF-353, KF-615A, KP-112, KP-341, X-22-4515, KF-354L, KT-355A, KF-6004, KF-6011, KF-6011P, KF-6012, KF-6013, KF-6015, KF-6016, KF-6017, KE-6017P, KE-6020, KF-6028, KF-6028P, KF-6038, KF-6043, KF-6048, KF-6123, KF-6204, KF-640, KF-642, KF-643, KF-644, KF-945, KP-110, KP-355, KP-369, KS-604, Polon SR-Cone, X-22-4272, and X-22-4952 (all manufactured by Shin-Etsu Chemical Co., Ltd.), 8526 ADDITIVE, FZ-2203, FZ-5609, L-7001, SF 8410, 2501 COSMETIC WAX, 5200 FORMULATION AID, 57 ADDITIVE, 8019 ADDITIVE, 8029 ADDITIVE, 8054 ADDITIVE, BY-16-036, BY16-201, ES-5612, FORMULATION AID, FZ-2104, FZ-2108, FZ-2110, FZ-2123, 17-2162, FZ-2164, FZ-2191, FZ-2207, FZ-2208, FZ-2222, FZ-7001, FT 77, L-7002, L-7604, SF8427, SF8428, SII 28 PALNR ADDITIVE, SH3749, SH3773M, SH8400, and SH8700 (all manufactured by Dow Corning bray Co., Ltd.), BYK-333, BYK-378, BYK-302, BYK-307, BYK-331, BYK-345, BYK-3455, BYK-347, BYK-348, BYK-349, and BYK-377 (all manufactured by BYK Japan. K. K.), Silwet L-7001, Silwet L-7002, Silwet L-720, Silwet L-7200, Silwet L-7210, Silwet L-7220, Silwet L-7230, Silwet. L-7605, TSF4440, TSF4441, ISF4445TSF4446, TSF4450, TSF4452, TSF4460, Silwet Hydrostabie 68, Silwet L-722, Silwet L-7280, Silwet L-7500, Silwet L-7550, Silwet L-7600, Silwet L-7602, Silwet L-7604, Silwet L-7607, Silwet L-7608, Silwet L-7622, Silwet L-7650, Silwet L-7657, Silwet L-77, Silwet L-8500, and Silwet L-8610 (all manufactured by Momentive Performance Materials Inc.).

The content of the silicone compound in the temporary adhesion composition of the present invention is preferably 0.001% by mass or greater, more preferably 0.002% by mass or greater, still more preferably 0.01% by mass or greater, even still more preferably 0.03% by mass or greater, particularly preferably 0.04% by mass or greater, and more particularly preferably 0.05% by mass or greater with respect to the mass of the temporary adhesion composition from which a solvent is removed. The upper limit of the content of the silicone compound is preferably 0.9% by mass or less, more preferably 0.6% by mass or less, still more preferably 0.4% by mass or less, even still more preferably 0.3% by mass or less, even still more preferably 0.2% by mass or less, and even still more preferably 0.1% by mass or less with respect to the mass of the temporary adhesion composition from which a solvent is removed.

Particularly in the present invention, when the content of the silicone compound is set to be in a range of 0.001% to 1% by mass and preferably in a range of 0.001% to 0.09% by mass, floating of a wafer edge at the time of obtaining a laminate is effectively suppressed. Since the silicone liquid compound is a compound which is unevenly distributed, the release properties can be sufficiently ensured even in a case where the amount of the silicone compound to be formulated is small. In a case where a combination of two or more kinds thereof is used, it is preferable that the total content is in the above-described range.

<<Plasticizer>>

The temporary adhesion composition used in the present invention may contain a plasticizer as necessary. A temporary adhesion film having the above-described performance can be obtained by formulating a plasticizer.

As the plasticizer, phthalic acid ester, fatty acid ester, aromatic polyvalent carboxylic acid ester, polyester, or the like can be used.

Examples of the phthalic acid ester include DMP, DEP, DBP, #10, BBP, DOP, DINP, and DIDP (all manufactured by DAIHACHI CHEMICAL INDUSTRY CO., LID.), PL-200 and DOIP (both manufactured by CO Ester Corporation), and SANSO CIZER DUP (manufactured by New Japan Chemical Co., Ltd.).

Examples of the fatty acid ester include butyl stearate, UNISTER M-9676, UNISTRE M-2222SL, UNISTER H-476, UNISTER H-476D, PANACET 800B, PANACET 875, and PANACET 810 (all manufactured by NOF CORPORATION), DBA, DIBA, DBS, DOA, DINA, DIDA, DOS, BXA, DOZ, and DESU (all manufactured by DAIHACHI CHEMICAL INDUSTRY CO., LTD.).

Examples of the aromatic polyvalent carboxylic acid ester include TOTM (manufactured by DAIHACHI CHEMICAL INDUSTRY CO., LTD.), MONOCIZER W-705 (manufactured by DAIHACHI CHEMICAL INDUSTRY CO., LTD), UL-80, and UL-100 (both manufactured by ADEKA CORPORATION).

Examples of the polyester include POLYCIZER TD-1720, POLYCIZER S-2002, POLYCIZER S-2010 (all manufactured by DIC Corporation), and BAA-15 (both manufactured by DAIHACHI CHEMICAL INDUSTRY CO., LTD.).

Among the above-described plasticizers, DIDP, DIDA, TOTM, UNISTER M-2222SL, and POLYCIZER. TD-1720 are preferable, DIDA AND TOTM are more preferable, and TOTM is particularly preferable.

The plasticizers may be used alone or in combination of two or more kinds thereof.

From the viewpoint of preventing sublimation during heating, when the weight change of the plasticizer is measured under conditions of raising the temperature at a constant rate of 20° C./min in a nitrogen stream, the temperature at which the weight thereof is decreased by 1% by mass is preferably 250° C. or higher, more preferably 270° C. or higher, and particularly preferably 300° C. or higher. The upper limit is not particularly limited, but can be set to 500° C. or lower.

The amount of the plasticizer to be added is preferably in a range of 0.01% by mass to 5.0% by mass and more preferably in a range of 0.1% by mass to 2.0% by mass with respect to the total solid content of the temporary adhesion composition.

<<Antioxidant>>

The temporary adhesion composition of the present invention may contain an antioxidant. As the antioxidant, a phenol-based antioxidant, a sulfur-based antioxidant, a phosphorus-based antioxidant, a quinone-based antioxidant, or an amino-based antioxidant can be used.

Examples of the phenol-based antioxidant include p-methoxyphenol, 2,6-di-tert-butyl-4-methylphenol, Irganox 1010, Irganox 1330, Irganox 3114, Irganox 1035

(all manufactured by BASF Japan Ltd.), Sumilizer MDP-S, and Sumilizer GA-80 (both manufactured by SUMITOMO CHEMICAL Co., Ltd.).

Examples of the sulfur-based antioxidant include 3,3'-thiodipropionate distearyl, Sumilizer TPM, Sumilizer TPS, and Sumilizer TP-D (all manufactured by SUMITOMO CHEMICAL Co., Ltd.).

Examples of the phosphorus-based antioxidant include tris(2,4-di-tert-butylphenyl)phosphite, bis(2,4-di-tert-butylphenyl)pentaerythritol diphosphate, poly(dipropyleneglycol)phenyl phosphite, diphenyl isodecyl phosphite, 2-ethylhexyldiphenyl phosphite, triphenyl phosphite, Irgafos168, and irgafos38 (all manufactured by BASF Japan Ltd.).

Examples of the quinone-based antioxidant include p-benzoquinone, and 2-tert-butyl-1,4-benzoquinone.

The examples of the amine-based antioxidant include dimethylaniline and phenothiazine.

As the antioxidant, Irganox 1010, Irganox 1330, 3,3'-thiodipropionate distearyl, and Sumilizer TP-D are preferable, Irganox 1010 and Irganox 1330 are more preferable, and Irganox 1010 is particularly preferable.

Among the above-described antioxidants, a combination of a phenol-based antioxidant and a sulfur-based antioxidant or a phosphorus-based antioxidant is preferable and a combination of a phenol-based antioxidant and a sulfur-based antioxidant is most preferable. Particularly, in a case where a polystyrene-based elastomer is used as an elastomer, a combination of a phenol-based antioxidant and a sulfur-based antioxidant is preferable. By combining a phenol-based antioxidant and a sulfur-based antioxidant, an effect of efficiently suppressing deterioration of the binder due to an oxidation reaction can be expected. In a case where a phenol-based antioxidant and a sulfur-based antioxidant are used in combination, the ratio of the mass of the phenol-based antioxidant to the mass of the sulfur-based antioxidant (phenol-based antioxidant:sulfur-based antioxidant) is preferably in a range of 95:5 to 5:95 and more preferably in a range of 25:75 to 75:25.

As the combination of antioxidants, a combination of Irganox 1010 and Sumilizer TP-D, a combination of Irganox 1330 and Sumilizer TP-D, and a combination of Sumilizer GA-80 and Sumilizer TP-D are preferable, a combination of Irganox 1010 and Sumilizer TP-D and a combination of Irganox 1330 and Sumilizer TP-D are more preferable, and a combination of Irganox 1010 and Sumilizer TP-D is particularly preferable.

From the viewpoint of preventing sublimation during heating, the molecular weight of the antioxidant is preferably 400 or greater, more preferably 600 or greater, and particularly preferably 750 or greater.

In a case where the temporary adhesion composition contains an antioxidant, the content of the antioxidant is preferably in a range of 0.001% to 20.0% by mass and more preferably in a range of 0.005% to 10.0% by mass with respect to the total solid content of the temporary adhesion composition.

The antioxidant may be used alone or in combination of two or more kinds thereof. In a case where two or more kinds of antioxidants are used in combination, it is preferable that the total amount thereof is in the above-described range.

<<Solvent>>

It is preferable that the temporary adhesion composition of the present invention contains a solvent. As the solvent, known solvents can be used without limitation and organic solvents are preferable.

Preferred examples of the organic solvents include esters, for example, ethyl acetate, n-butyl acetate, isobutyl acetate, amyl formate, isoamyl acetate, butyl propionate, isopropyl butyrate, ethyl butyrate, butyl butyrate, methyl lactate, ethyl lactate, alkyl oxyacetate (such as methyl oxyacetate, ethyl oxyacetate, or butyl oxyacetate (such as methyl methoxy acetate, ethyl methoxy acetate, butyl methoxy acetate, methyl ethoxy acetate, or ethyl ethoxy acetate)), 3-oxypropionic acid alkyl esters (such as methyl 3-oxopropionate and ethyl 3-oxopropionate (such as methyl 3-methoxy propionate, ethyl 3-methoxy propionate, methyl 3-ethoxy propionate, or ethyl 3-ethoxy propionate)), 2-oxypropionic acid alkyl esters (such as methyl 2-oxopropionate, ethyl 2-oxopropionate, and propyl 2-oxopropionate (such as methyl 2-methoxy propionate, ethyl 2-methoxy propionate, propyl 2-methoxy propionate, methyl 2-ethoxy propionate, or ethyl 2-ethoxy propionate)), methyl 2-oxy-2-methyl propionate and ethyl 2-oxy-2-methyl propionate (such as methyl 2-methoxy-2-methyl propionate or ethyl 2-ethoxy-2-methyl propionate), methyl pyruvate, ethyl pyruvate, propyl pyruvate, methyl acetoacetate, ethyl acetoacetate, methyl 2-oxobutanoate, ethyl 2-oxobutanoate, and 1-methoxy-2-propyl acetate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate; ketones such as methyl ethyl ketone, cyclohexanone, 2-heptanone, 3-heptanone, N-methyl-2-pyrrolidone, and γ-butyrolactone; pyrrolidones such as N-methyl-2-pyrrolidone and N-ethyl-2-pyrrolidone; aromatic hydrocarbons such as toluene, xylene, anisole, mesitylene, pseudocumene, ethylbenzene, propylbenzene, cumene, n-butylbenzene, sec-butylbenzene, isobutylbenzene, tert-butylbenzene, amylbenzene, isoamylbenzene, (2,2-dimethylpropyl)benzene, 1-phenylhexane, 1-phenylheptane, 1-phenyloctane, 1-phenylnonane, 1-phenyldecane, cyclopropylbenzene, cyclohexylbenzene, 2-ethyltoluene, 1,2-diethylbenzene, o-cymene, indane, 1,2,3,4-tetrahydronaplithalene, 3-ethyltoluene, m-cymene, 1,3-diisopropylbenzene, 4-ethyltoluene, 1,4-diethylbenzene, p-cymene, 1,4-diisopropyl benzene, 4-tert-butyltoluene, 1,4-di-tert-butylbenzene, 1,3-diethylbenzene, 1,2,3-trimethylbenzene, 1,2,4-trimethylbenzene, 4-tert-butyl-o-xylene, 1,2,4-triethylbenzene, 1,3,5-triethylbenzene, 1,3,5-triisopropylbenzene, 5-tert-butyl-m-xylene, 3,5-di-tert-butyltoluene, 1,2,3,5-tetramethylbenzene, 1,2,4,5-tetramethylbenzene, pentamethylbenzene, and decahydronaphthalene, and aliphatic hydrocarbons such as ethyl cyclohexane, limonene, p-menthane, nonane, decane, dodecane, and decalin.

From the viewpoint of improving a coated surface state, it is preferable that these solvents are used in the form of a mixture of two or more kinds thereof. In this case, a mixed solution containing two or more selected from mesitylene, tert-butylbenzene, pseudocumene, p-menthane, γ-butyrolactone, N-ethyl-2-pyrrolidone, anisole, methyl 3-ethoxy propionate, ethyl 3-ethoxy propionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate is particularly preferable.

In a case where the temporary adhesion composition includes a solvent, from the viewpoint of coating properties, the content of the solvent in the temporary adhesion composition is adjusted such that the concentration of total solid contents of the temporary adhesion composition is preferably in a range of 5% to 80% by mass, more preferably in a range of 5% to 70% by mass, and particularly preferably in a range of 10% to 60% by mass.

The solvent may be used alone or in combination of two or more kinds thereof. In a case where two or more kinds of solvents are used, it is preferable that the total amount thereof is in the above-described range.

<Surfactant>

It is preferable that the temporary adhesion composition of the present invention contains a surfactant.

As the surfactant, an anionic surfactant, a cationic surfactant, a non-ionic surfactant, or an amphoteric surfactant can be used. Among these, a non-ionic surfactant is preferable.

Preferred examples of the non-ionic surfactant include polyoxyethylene higher alkyl ethers, polyoxyethylene higher alkyl phenyl ethers, and polyoxyethylene glycol higher fatty acid diesters.

In a case where the temporary adhesion composition contains a surfactant, from the viewpoint of coating properties, the content of the surfactant in the temporary adhesion composition is preferably in a range of 0.001% to 5% by mass, more preferably in a range of 0.005% to 1% by mass, and particularly preferably in a range of 0.01% to 0.5% by mass with respect to the total solid content of the temporary adhesion composition. The surfactant may be used alone or in combination of two or more kinds thereof. In a case where two or more kinds of surfactants are used, it is preferable that the total amount thereof is in the above-described range.

<<Other Additives>>

As necessary, various additives such as a curing agent, a curing catalyst, a silane coupling agent, a filler, an adhesion promotor, an ultraviolet absorbing agent, and an aggregation inhibitor can be formulated into the temporary adhesion composition of the present invention as long as the effects of the present invention are not impaired. In a case where these additives are formulated into the temporary adhesion composition, the total amount of the additives to be formulated is preferably 3% by mass or less of the total solid content of the temporary adhesion composition.

It is preferable that the temporary adhesion composition of the present invention does not contain impurities such as metals. The content of impurities contained in these materials is preferably 1 ppm by mass (parts per million) or less, more preferably 100 ppt by mass (parts per trillion) or less, and still more preferably 10 ppt by mass or less. It is particularly preferable that the temporary adhesion composition does not substantially contain impurities (below the detection limit of a determination device).

As a method of removing impurities such as metals from the temporary adhesion composition, a method of filtration using a filter may be exemplified. The pore diameter of the filter is preferably 10 nm or less, more preferably 5 nm or less, and still more preferably 3 nm or less. As the material of the filter, a filter made of polytetrafluoroethylene, a filter made of polyethylene, or a filter made of nylon is preferable. Further, a filter which has been washed with an organic solvent in advance may be used. In the filter filtration step, a plurality of filters may be connected in series or in parallel. In a case where a plurality of filters are used, filters having different pore diameters and/or being formed of different materials may be used in combination. Further, various materials may be filtered multiple times, and a step of performing filtration multiple times may be a circulation filtration step.

Further, as a method of reducing impurities such as metals contained in the temporary adhesion composition, a method of performing distillation under conditions of suppressing contamination as much as possible by selecting a raw material having a small amount of metal as the raw material constituting the temporary adhesion composition, performing filter filtration on the raw material constituting the temporary adhesion composition, performing lining the inside the device using Teflon (registered trademark), and the like may be exemplified. Preferable conditions for performing filter filtration on the raw material constituting the temporary adhesion composition are the same as the conditions described above.

In addition to the filter filtration, impurities may be removed using an adsorbent and a combination of filter filtration and an adsorbent may be used. Known adsorbents can be used as the adsorbent, and examples thereof include inorganic adsorbents such as silica gel or zeolite and organic adsorbents such as activated carbon.

<Preparation of Temporary Adhesion Composition>

The temporary adhesion composition of the present invention can be prepared by mixing the above-described components. The components are typically mixed in a temperature range of 0° C. to 100° C. Further, it is preferable that the components are mixed and then filtered using a filter. The filtration may be performed in multiple stages or may be repeated multiple times. In addition, the filtered liquid can be filtered again.

The filter is not particularly limited as long as the filter has been used for the filtration conventionally. Examples of the material of the filter include a fluorine resin such as polytetrafluoroethylene (PTFE), a polyamide resin such as nylon-6 or nylon-6,6, and a polyolefin resin (having a high density and an extremely high molecular weight) such as polyethylene or polypropylene (PP). Among these materials, polypropylene (including high-density polypropylene) and nylon are preferable.

The pore diameter of the filter is suitably in a range of 0.003 to 5.0 µm. When the pore diameter is in this range, fine foreign matter such as impurities or aggregates contained in the composition can be reliably removed while filter clogging is suppressed.

At the time of using a filter, a different filter may be used in combination. At this time, filtration with a first filter may be performed only once or two or more times. In a case where filtration is performed two or more times by combining a different filter with the first filter, it is preferable that the pore diameter of the filter used for the second or subsequent filtration is the same as or smaller than the pore diameter of the first filter used for the first filtration. Further, the first filter having a different pore diameter within the above-described range may be used in combination. As for the pore diameter here, nominal values of filter manufacturers can be referred to. Commercially available filters can be selected from various filters provided by Pall Corporation, ADVANTEC MFS INC., ENTEGRIS, INC., and KITZ MICROFILTER CORPORATION.

<Method of Manufacturing Semiconductor Device>

First Embodiment

Hereinafter, a first embodiment of a method of manufacturing a semiconductor device after a step of manufacturing a laminate will be described in detail with reference to FIG. 1. In addition, the present invention is not limited to the following embodiments.

FIGS. 1(A) to 1(E) are respectively cross-sectional views (FIGS. 1(A) and 1(B)) schematically describing temporary adhesion between a carrier base material and a device wafer; a cross-sectional view (FIG. 1(C)) schematically illustrating a state in which the device wafer temporarily adhering the carrier base material is thinned; a cross-sectional view (FIG. 1(D)) schematically illustrating a state in which the carrier base material and the device wafer are peeled off from each other; and a cross-sectional view (FIG. 1(E)) schematically illustrating a state in which the temporary adhesion film has been removed from the device wafer.

In the embodiment, as illustrated in FIG. 1(A), an adhesive carrier base material 100 formed by providing a temporary adhesion film 11 on a carrier base material 12 is prepared.

It is preferable that the temporary adhesion film 11 does not substantially contain a solvent.

In a device wafer 60, a plurality of device chips 62 are provided on a surface 61a of a silicon substrate 61.

The thickness of the silicon substrate 61 is preferably in a range of 200 to 1200. It is preferable that the device chip 62 is a metal structure, and the thickness thereof is preferably in a range of 10 to 100 μm.

In the step of forming a temporary adhesion film, a step of washing the rear surface the carrier base material and the rear surface of the device wafer with a solvent may be provided. Specifically, it is possible to prevent contamination of a device by removing residues of the temporary adhesion film adhering to the end surface or the rear surface of the base material or the wafer using a solvent that dissolves the temporary adhesion film and to decrease a total thickness variation (TTV) of a thin device wafer.

The solvent contained in the above-described temporary adhesion composition can be used as the solvent used in the step of washing the rear surface of the carrier base material or the device wafer with a solvent.

Next, as illustrated in FIG. 1(B), the adhesive carrier base material 100 and the device wafer 60 are crimped to each other and then the carrier base material 12 and the device wafer 60 temporarily adhere to each other.

It is preferable that the device chip 62 is completely covered with the temporary adhesion film 11 and the relationship of "X+100≥Y>X" is satisfied in a case where the height of the device chip is set to X μm and the thickness of the temporary adhesion film is set to Y μm.

The complete coverage of the device chip 62 with the temporary adhesion film 11 is effective in a case where the TTV of the thin device wafer is expected to be further decreased (that is, in a case where the flatness of the thin device wafer is expected to be further improved).

In other words, at the time of reduction of the thickness of the device wafer, an uneven shape can be almost eliminated from the surface in a state where a plurality of device chips 62 are in contact with the carrier base material 12 by protecting the plurality of device chips 62 with the temporary adhesion film 11. Therefore, even when the device wafer is thinned in this supported state, the possibility that the shape derived from the plurality of device chins 62 is transferred to a rear surface 61b1 of the thinned device wafer is decreased. As the result, the TTV of the thinned device wafer to be finally obtained can be further reduced.

Next, a mechanical or chemical treatment (the treatment is not particularly limited, and examples thereof include a thinning treatment such as gliding or chemical and mechanical polishing (CMP), a treatment under a high temperature condition in a vacuum such as chemical vapor deposition (CVD) or physical vapor deposition (PVD), a treatment using chemicals such as an organic solvent, an acidic treatment liquid, and a basic treatment liquid, a plating treatment, irradiation with active rays, a heat treatment, and a cooling treatment) is performed on a rear surface 61b of the silicon substrate 61 as illustrated in FIG. 1(C), and then the thickness of the silicon substrate 61 is reduced (for example, the thickness is reduced to have the thickness described above) as illustrated in FIG. 1(C), thereby obtaining a thin device wafer 60a.

After the device wafer is thinned, a step of washing a temporary adhesion film protruding to the outside the area of the base material surface of the device wafer with a solvent may be provided at the stage of before the treatment under a high temperature condition in a vacuum is performed. Specifically, the deformation or deterioration of the temporary adhesion film caused by directly applying the treatment under a high temperature condition in a vacuum to the temporary adhesion film can be prevented by removing the protruding portion of the temporary adhesion film with a solvent that dissolves the temporary adhesion film after the device wafer is thinned. As the solvent used for the step of washing the temporary adhesion film protruding to the outside the area of the base material surface of the carrier base material or the area of the base material surface of the device wafer with a solvent, the solvent contained in the temporary adhesion composition can be used.

In other words, in the present invention, it is preferable that the area of the film surface of the temporary adhesion film is smaller than the area of the base material surface of the carrier base material. In the present invention, when the diameter of the base material surface of the carrier base material is set to C μm, the diameter of the base material surface of the device wafer is set to D μm, and the diameter of the film surface of the temporary adhesion film is set to T μm, is more preferable that the relationship of "(C−200)≥T≥D" is satisfied. Further, when the diameter of the base material surface of the carrier base material is set to C μm, the diameter of the base material surface of the device wafer is set to D μm, the diameter of the film surface of the temporary adhesion film on a side where the temporary adhesion film is in contact with the carrier base material is set to $T_C$ μm, and the diameter of the surface of the temporary adhesion film on a side where the temporary adhesion film is in contact with the device wafer is set to $T_D$ μm, it is preferable that the relationship of "(C−200)≥$T_C$>$T_D$≥D" is satisfied. With this configuration, the deformation or deterioration of the temporary adhesion film caused by directly applying the treatment under a high temperature condition in a vacuum to the temporary adhesion film can be prevented.

Further, the area of the film surface of the temporary adhesion film indicates the area when seen from a direction perpendicular to the carrier base material and the unevenness of the film surface will not be considered. The same applies to the base material surface of the device wafer. In other words, the base material surface of the device wafer indicates the surface corresponding to the surface 61a of FIG. 1 and this may be the surface on a side where device chips are provided. The same applies to the diameter of the film surface of the temporary adhesion film or the like.

In addition, a diameter T of the film surface of the temporary adhesion film is obtained using an equation of "T=($T_C$+$T_D$)/2" when the diameter of the film surface of the temporary adhesion film on a side where the temporary adhesion film is in contact with the carrier base material is set to $T_C$ μm and the diameter of the film surface of the temporary adhesion film on a side where the temporary adhesion film is in contact with the device wafer is set to $T_D$ μm. The diameter of the base material surface of the carrier base material and the diameter of the base material surface of the device wafer indicate the diameter of the surface on a side where the temporary adhesion film is in contact with the carrier base material or the device wafer.

In the carrier base material or the like, the term "diameter" is used for definition, the carrier base material or the like does not need to be circular (perfect circle) in a mathematical sense. It is sufficient that the carrier base material or the like is substantially circular. In a case where the carrier base material or the like does not have a shape of a perfect circle, the diameter when converted to a perfect circle with the same area is set as the above-described diameter.

In addition, as the mechanical or chemical treatment, a treatment of forming a through-hole (not illustrated) penetrating the silicon substrate from the rear surface 61b1 of the thin device wafer 60a and then thrilling a through-silicon via (not illustrated) in the through-hole may be performed after the treatment of reducing the thickness.

Further, a heat treatment may be performed after the carrier base material 12 and the device wafer 60 temporarily adhere to each other and before the carrier base material 12 and the device wafer 60 are peeled off from each other. As an example of the heat treatment, a treatment of performing heating during the mechanical or chemical treatment may be exemplified.

The highest temperature during the heat treatment is preferably in a range of 80° C. to 400° C., more preferably in a range of 130° C. to 400° C., and still more preferably in a range of 180° C. to 350° C. It is preferable that the highest temperature during the heat treatment is set to be lower than the decomposition temperature of the temporary adhesion film. It is preferable that the heat treatment is performed by heating the surface at the highest temperature for 30 seconds to 30 minutes and more preferable that the heat treatment is performed by heating the surface at the highest temperature for 1 minute to 10 minutes.

Next, as illustrated in FIG. 1(D), the carrier base material 12 is peeled off from the thin device wafer 60a. The temperature at the time of peeling is preferably 40° C. or lower and can be set to 30° C. or lower. The lower limit of the temperature at the time of peeling is, for example, 0° C. or higher and preferably 10° C. or higher. The peeling of the present invention is valuable from the viewpoint that the peeling can be performed at room temperature of 15° C. to 35° C.

The method of peeling is not particularly limited, but it is preferable that the carrier base material 12 is peeled off by fixing the thin device wafer 60a and pulling the end portion up in the direction perpendicular to the thin device wafer 60a from the end portion of the carrier base material laminate. At this time, it is preferable that the peeling is performed at the interface between the carrier base material 12 and the temporary adhesion film 11. The pulling speed during the peeling is preferably in a range of 30 to 100 mm/min and more preferably in a range of 40 to 80 mm/min. At this time, it is preferable that an adhesion strength A at the interface between the carrier base material 12 and the temporary adhesion film 11 and an adhesion strength B between the surface 61a of the device wafer and the temporary adhesion film 11 satisfy the following formula.

$A<B$ Formula (A)

Further, the force of pulling the end portion during the peeling is preferably 0.33 N/mm or less and more preferably 0.2 N/mm or less. The lower limit is preferably 0.07 N/mm or greater. The force during the peeling can be measured using a force gauge.

Further, as illustrated in FIG. 1(E), a thin device wafer can be obtained by removing the temporary adhesion film 11 from the thin device wafer 60a.

Examples of the method of removing the temporary adhesion film 11 include a method of peeling and removing the temporary adhesion film as it is, a method of removing the temporary adhesion film using a peeling solution (a method of peeling and removing the temporary adhesion film after the temporary adhesion film is swollen by a peeling solution, a method of destroying and removing the temporary adhesion film by spraying a peeling solution to the film, or a method of dissolving and removing the temporary adhesion film by dissolving the film in a peeling solution), and a method of removing the temporary adhesion film by irradiating the film with active rays, radiation, or heat so that the film is decomposed and vaporized. From the viewpoint of reducing the amount of a solvent to be used, it is preferable that the temporary adhesion film is removed by maintaining the form of a film. Further, from the viewpoint of reducing damage to the surface of the device wafer, it is preferable that the temporary adhesion film is dissolved and then removed. The method of peeling and removing the temporary adhesion film as it is means that the temporary adhesion film is peeled off in the state of the temporary adhesive without being subjected to a chemical treatment using a peeling solution or the like, and the method of peeling and removing the temporary adhesion film by maintaining the form of a film is more preferable. In a case where the temporary adhesion film is peeled off as it is, mechanical peeling is preferably used. In order to remove the temporary adhesion film by maintaining the form of a film, it is preferable that the adhesion strength B between the surface 61a of the device wafer and the temporary adhesion film 11 satisfies Formula (B).

$B<4$ N/cm Formula (B)

In a case where the temporary adhesion film is removed using a peeling solution, the following peeling solution can be preferably used.

<Peeling Solution>

As the peeling solution, water and solvents (organic solvents) can be used.

Further, an organic solvent that dissolves the temporary adhesion film 11 is preferable as the peeling solution. Examples of the organic solvent include aliphatic hydrocarbons (such as hexane, heptane, ISOPAR E, ISOPAR H, ISOPAR G (manufactured by Exxon Chemical Co., Ltd.), limonene, p-menthane, nonane, decane, dodecane, and decalin), aromatic hydrocarbons (toluene, xylene, anisole, mesitylene, pseudocumene, ethylbenzene, propylbenzene, cumene, n-butylbenzene, sec-butylbenzene, isobutylbenzene, tert-butylbenzene amylbenzene, isoamylbenzene, (2,2-dimethylpropyl)benzene, 1-phenylhexane, 1-phenylheptane, 1-phenyloctane, 1-phenylnonane, 1-phenyldecane, cyclopropylbenzene, cyclohexylbenzene, 2-ethyltoluene, 1,2-diethylbenzene, o-cymene, indane, 1,2,3,4-tetrahydronaphthalene, 3-ethyltoluene, m-cymene, 1,3-diisopropylbenzene, 4-ethyltoluene, 1,4-diethylbenzene, p-cymene, 1,4-diisopropylbenzene, 4-tort-butyltoluene, 1,4-di-tert-butylbenzene, 1,3-diethylbenzene, 1,2,3-trimethylbenzene, 1,2,4-trimethylbenzene, 4-tert-butyl-o-xylene, 1,2,4-triethylbenzene, 1,3,5-triethylbenzene, 1,3,5-triisopropylbenzene, 5-tert-butyl-m-xylene, 3,5-di-tert-butyl toluene, 1,2,3,5-tetramethylbenzene, 1,2,4,5-tetramethylbenzene, and pentamethylbenzene), and halogen hydrocarbons (such as methylene dichloride, ethylene dichloride, trichlene, and monochlorobenzene), and polar solvents. Examples of the polar solvents include alcohols (methanol, ethanol, propanol, isopropanol, 1-butanol, 1-pentanol, 1-hexanol, 1-heptanol, 1-octanol, 2-octanol, 2-ethyl-1-hexanol, 1-nonanol, 1-decanol, benzyl alcohol, ethylene glycol monomethyl ether, 2-ethoxy ethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, propylene glycol monophenyl ether, methyl phenyl carbinol, n-amyl alcohol, and methyl amyl alcohol), ketones (such as acetone, methyl ethyl ketone, ethyl butyl ketone, methyl isobutyl ketone, and cyclohexanone), esters (ethyl acetate, propyl acetate, butyl acetate, amyl acetate, benzyl acetate, methyl lactate, butyl lactate, ethylene glycol monobutyl acetate, propylene glycol monomethyl ether acetate, diethylene glycol acetate, diethylene phthalate, and butyl levitate), and others (such as triethyl phosphate, tricresyl phosphate, N-phenyl ethanolamine, N-phenyl diethanolamine, N-methyl diethanolamine, N-ethyl diethanolamine, 4-(2-hydroxyethyl)morpholine, N,N-dimethylacetamide, N-methylpyrrolidone, and N-ethyl-2-pyrrolidone).

Further, from the viewpoint of the peeling properties, the peeling solution may contain an alkali, an acid, and a surfactant. In a case where these components are formulated, the amount of each of these components to be formulated is preferably in a range of 0.1% to 5.0% by mass of the peeling solution.

From the viewpoint of the peeling properties, it is preferable that two or more kinds of organic solvents and water, two or more kinds of alkalis, and an acid and a surfactant may be mixed.

Examples of the alkali include inorganic alkaline agents such as tribasic sodium phosphate, tribasic potassium phosphate, tribasic ammonium phosphate, dibasic sodium phosphate, dibasic potassium phosphate, dibasic ammonium phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide, and lithium hydroxide; and organic alkaline agents such as monomethyl amine, dimethylacetamide, trimethylamine, monoethylamine, diethylamine, trimethylamine, monoisopropylamine, diisopropylamine, triisopropylamine, n-butylamine, monoethanolamine, diethanolamine, triethanolamine, monoisopropanolamine, diisopropanolamine, ethyleneimine ethylenediamine, pyridine, tetramethylammonium hydroxide. These alkaline agents may be used alone or in combination of two or more kinds thereof.

Examples of the acid include an inorganic acid such as hydrogen halide, sulfuric acid, nitric acid, phosphoric acid or boric acid; and an organic acid such as methanesulfonic acid, ethanesulfonic acid, benzenesulfonic acid, p-toluenesulfonic acid, trifluoromethanesulfonic acid, acetic acid, citric acid, formic acid, gluconic acid, lactic acid, oxalic acid, and tartaric acid.

As the surfactant, an anionic surfactant, a cationic surfactant, a non-ionic surfactant, or an amphoteric surfactant can be used. In this case, the content of the surfactant is preferably in a range of 1% to 20% by mass and more preferably in a range of 1% to 10% by mass with respect to the total amount of the alkali aqueous solution.

When the content of the surfactant is in the above-described range, the peeling properties between the temporary adhesion film 11 and the thin device wafer 60a are likely to be further improved.

The anionic surfactant is not particularly limited, and examples thereof include fatty acid salts, abietic acid salts, hydroxy alkanes sulfonic acid salts, alkane sulfonic acid salts, dialkyl sulfosuccinic acid salts, linear alkyl benzene sulfonic acid salts, branched alkyl benzene sulfonic acid salts, alkyl naphthalene sulfonic acid salts, alkyl diphenyl ether (di)sulfonic acid salts, alkyl phenoxy polyoxyethylene alkyl sulfonic acid salts, polyoxyethylene alkyl sulfophenyl ether salts, N-alkyl-N-oleoyltaurine sodium salts, N-alkyl sulfosuccinic acid monoamide disodium salts, petroleum sulfonates, sulfated castor oil, sulfated beef tallow oil, sulfate ester salts of fatty acid alkyl ester, alkyl sulfuric acid ester salts, polyoxyethylene alkyl ether sulfuric acid ester salts, fatty acid monoglyceride sulfuric acid ester salts, polyoxyethylene alkyl phenyl ether sulfuric acid ester salts, polyoxyethylene styryl phenyl ether sulfuric acid ester salts, alkyl phosphoric acid ester salts, polyoxyethylene alkyl ether phosphoric acid ester salts, polyoxyethylene alkyl phenyl ether phosphoric acid ester salts, partially saponification products of a styrene-maleic anhydride copolymer, partial saponification products of an olefin-maleic anhydride copolymer, and naphthalene sulfonate formalin condensates. Among these, alkyl benzene sulfonates, alkyl naphthalene sulfonates, and alkyl diphenyl ether (di)sulfonates are particularly preferably used.

The cationic surfactant is not particularly limited, and conventionally known surfactants can be used. Examples of the known cationic surfactants include alkylamine salts, quaternary ammonium salts, alkyl imidazolinium salts, polyoxyethylene alkylamine salts, and polyethylene polyamine derivatives.

The non-ionic surfactant is not particularly limited, and examples thereof include a polyethylene glycol type higher alcohol ethylene oxide adduct, an alkyl phenol ethylene oxide adduct, an alkyl naphthol ethylene oxide adduct, a phenol ethylene oxide adduct, a naphthol ethylene oxide adduct, a fatty acid ethylene oxide adduct, a polyhydric alcohol fatty acid ester ethylene oxide adduct, a higher alkylamine ethylene oxide adduct, a fatty acid amide ethylene oxide adduct, an ethylene oxide adduct of fat and oil, a polypropylene glycol ethylene oxide adduct, a dimethylsiloxane-ethylene oxide block copolymer, a dimethylsiloxane-(propylene oxide-ethylene oxide) block copolymer, a fatty acid ester of polyhydric alcohol type glycerol, a fatty acid ester of pentaerythritol, a fatty acid ester of sorbitol and sorbitan, a fatty acid ester of sucrose, alkyl ether of polyhydric alcohol, and fatty acid amides of alkaneamines. Among these, those having an aromatic ring and an ethylene oxide chain are preferable and an alkyl-substituted or unsubstituted phenol ethylene oxide adduct or an alkyl-substituted or unsubstituted naphthol ethylene oxide adduct is more preferable.

The amphoteric surfactant is not particularly limited, and examples thereof include an amine oxide-based surfactant such as alkyl dimethylamine oxide, a betaine-based surfactant such as alkyl betaine, and an amino acid-based surfactant such as sodium alkylamino fatty acid. Among these, particularly, alkyl dimethylamine oxide which may have a substituent, alkyl carboxy betaine which may have a substituent, and alkyl sulfobetaine which may have a substituent are preferably used. Specifically, compounds represented by Formula (2) in paragraph [0256] of JP2008-203359A, compounds represented by Formulae (I), (II), an (VI) in paragraph [0028] of JP2008-276166A, and compounds described in paragraphs [0022] to [0029] of JP2009-47927A can be used.

As necessary, additives such as an anti-foaming agent and a water opener for hard water can be further contained.

In a case where the carrier base material 12 is peeled off from the thin device wafer 60a, it is preferable that the peeling is performed by pulling an end portion up in a direction perpendicular to the device wafer from the end portion of the thin device wafer 60a without performing any treatments. Further, as the method of removing the temporary adhesion film 11 on the surface 61a of the device, wafer, a method of removing the temporary adhesion film by maintaining the form of a film is preferable.

In a case where the adhesion strength at the interface between the carrier base material 12 and the temporary adhesion film 11 is set to A and the adhesion strength between the surface 61a of the device wafer and the temporary adhesion film 11 is set to B, the carrier base material 12 and the temporary adhesion film 11 can be removed from the device wafer by satisfying Formula (A) and Formula (B) according to the above-described embodiment.

A semiconductor device including the thin device wafer 60a is manufactured by performing various known treatments on the thin device wafer 60a as necessary after the carrier base material 12 is peeled off from the thin device wafer 60a.

In a case where the temporary adhesion film adheres to the carrier base material, the carrier base material can be reproduced by removing the temporary adhesion film. Examples of the method of removing the temporary adhesion film include a method of physically removing the temporary adhesion film by maintaining the form of a film or using a brush, ultrasonic waves, ice particles, or spraying aerosol; a method of dissolving and removing the temporary adhesion film in an aqueous solution or an organic solvent; and a method of chemically removing the temporary adhesion film by irradiating the film with active rays, radiation, or heat so that the film is decomposed and vaporized. Further, depending on the carrier base material, conventionally known washing methods can be used.

For example, in a case where a silicon substrate is used as the carrier base material, conventionally known methods of washing a silicon wafer can be used. Examples of the aqueous solution or the organic solvent which can be used in a case where the temporary adhesion film is chemically removed include strong acids, strong bases, strong oxidants, or mixtures of these, and specific examples thereof include acids such as sulfuric acid, hydrochloric acid, hydrofluoric acid, nitric acid, and an organic acid, bases such as tetramethylammonium, ammonia, and an organic base, oxidants such as hydrogen peroxide, mixtures of ammonia and hydrogen peroxide, mixtures of hydrochloric acid and hydrogen peroxide water, mixtures of sulfuric acid and hydrogen peroxide water, mixtures of hydrofluoric acid and hydrogen peroxide water, and mixtures of hydrofluoric acid and ammonium fluoride.

From the viewpoint of the adhesiveness in a case where a reproduced carrier base material is used, it is preferable to use a carrier base material cleaning solution. It is preferable that the carrier base material cleaning solution contains an acid (strong acid) having a pKa of less than 0 and hydrogen peroxide. The acid having a pKa of less than 0 is selected from inorganic acids such as hydrogen iodide, perchloric acid, hydrogen bromide, hydrogen chloride, nitric acid, and sulfuric acid; and organic acids such as alkyl sulfonic acid and aryl sulfonic acid. From the viewpoint of washability of the temporary adhesion film on the carrier base material, inorganic acids are preferable and sulfuric acid is most preferable.

As the hydrogen peroxide, 30 mass % hydrogen peroxide water can be preferably used, and the mixing ratio between the above-described strong acid and 30 mass % hydrogen peroxide water is preferably in a range of 0.1:1 to 100:1, more preferably in a range of 1:1 to 10:1, and most preferably in a range of 3:1 to 5:1 in taints of the mass ratio.

Second Embodiment

Figure 2:
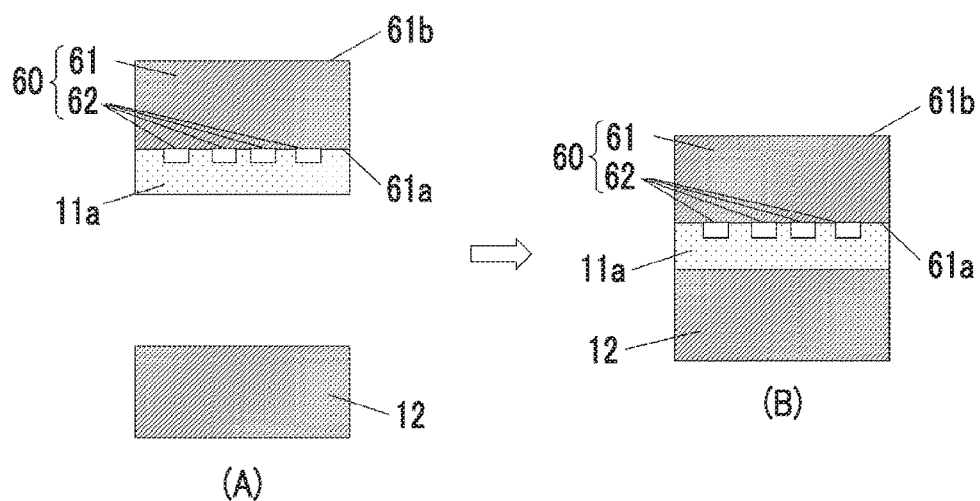
FIG. 2 is a view schematically illustrating a method of manufacturing a semiconductor device according to a second embodiment.
Figure 2:
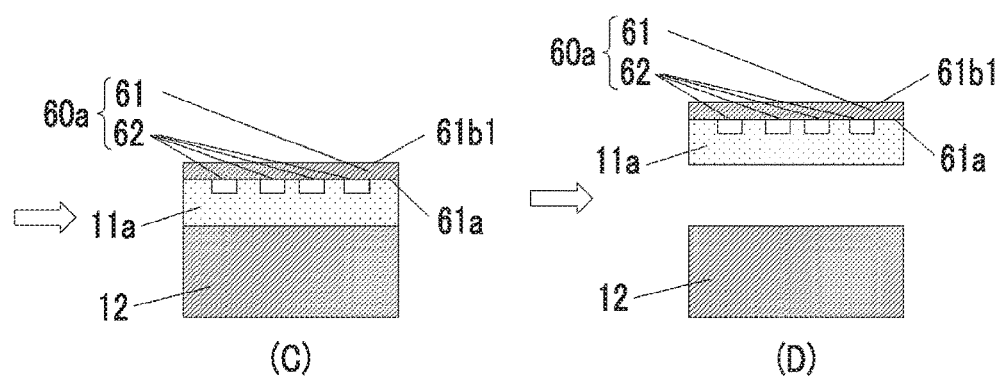
Figure 2:
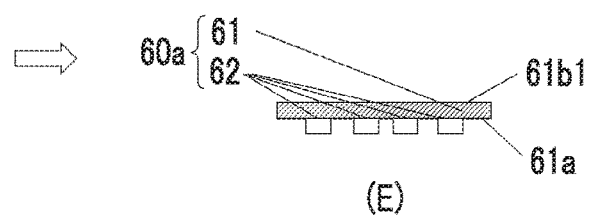

A second embodiment of a method of manufacturing a semiconductor after a step of manufacturing a laminate has been performed will be described with reference to FIG. 2. The same elements as those in the first embodiment described above are denoted by the same reference numerals and the description thereof will not be repeated.

FIGS. 2(A) to 2(E) are respectively cross-sectional views (FIGS. 2(A) and 2(B)) schematically describing temporary adhesion between a carrier base material and a device wafer; a cross-sectional view (FIG. 2(C)) schematically illustrating a state in which the device wafer temporarily adhering the carrier base material is thinned; a cross-sectional view (FIG. 2(D)) schematically illustrating a state in which the carrier base material and the device wafer are peeled off from each other; and a cross-sectional view (FIG. 2(E)) schematically illustrating a state in which the temporary adhesion film has been removed from the device wafer.

The second embodiment is different from the first embodiment described above in terms that the temporary adhesion film is formed on the surface 61a of the device wafer as illustrated in FIG. 2(A).

In a case where a temporary adhesion film 11a is provided on the surface 61a of the device wafer 60, the temporary adhesion film can be formed by applying a temporary adhesive to the surface 61a of the device wafer 60 (preferably the surface is coated with the temporary adhesive) and then drying (baking) the surface thereof. The surface is dried under a temperature condition of 60° C. to 150° C. for 10 seconds to 2 minutes.

Next, as illustrated in FIG. 2(B), the carrier base material 12 and the device wafer 60 are crimped to each other and then the carrier base material 12 and the device wafer 60 temporarily adhere to each other. Next, a mechanical or chemical treatment is performed on a rear surface 61b of the silicon substrate 61 as illustrated in FIG. 2(C), and then the thickness of the silicon substrate 61 is reduced as illustrated in FIG. 2(C), thereby obtaining a thin device wafer 60a. Next, as illustrated in FIG. 2(D), the carrier base material 12 is peeled off from the thin device wafer 60a. Further, as illustrated in FIG. 2(E), the temporary adhesion film 11 is removed from the thin device wafer 60a.

Embodiment of Related Art

Figure 3:
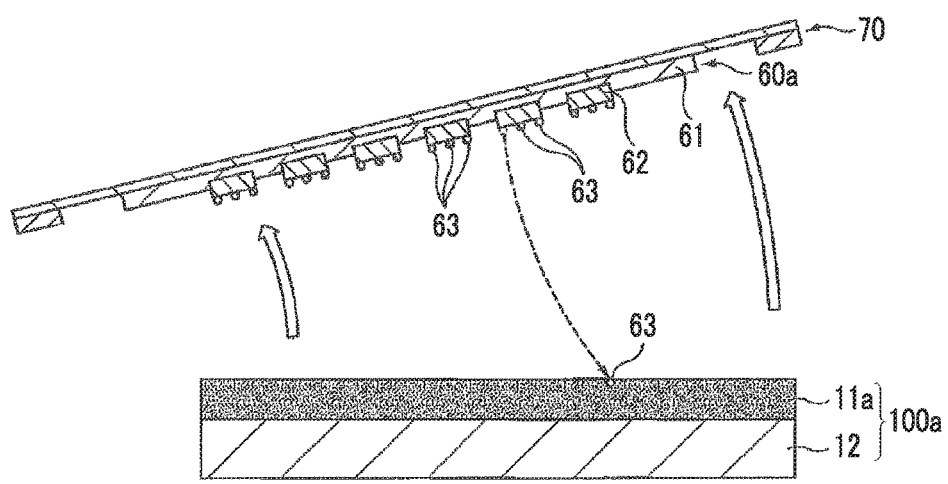
FIG. 3 is a cross-sectional view schematically describing releasing of a state in which an adhesive carrier base material and a device wafer of the related art temporarily adhere to each other.

Next, an embodiment of the related art will be described.
FIG. 3 is a cross-sectional view schematically illustrating release of a state in which a conventional adhesive carrier base material and a device wafer temporarily adhere to each other.

In the embodiment of the related art, as illustrated in FIG. 3, except that an adhesive carrier base material 100a obtained by providing a temporary adhesion film 11b formed on the carrier base material 12 using a temporary adhesive of the related art is used as the adhesive carrier base material 100a, the adhesive carrier base material 100a and the device water adhere to each other and a treatment of reducing the thickness of a silicon substrate in the device wafer by following the same procedures as described with reference to FIG. 1. Next, the thin device wafer 60a is peeled off from the adhesive carrier base material 100a by following the same procedures as described above.

However, according to a temporary adhesive of the related art, when the device wafer is temporarily supported by high adhesive force, it is difficult to easily release the temporary support with respect to the device wafer without damaging the device wafer. For example, in a case where a temporary adhesive with excellent adhesiveness is employed from among temporary adhesives of the related art in order for the device wafer and the carrier base material to temporarily adhere to each other sufficiently, the temporary adhesion between the device wafer and the carrier base material tends to be extremely strong. Accordingly, in a case where tape (for example, dicing tale) 70 is attached to the rear surface of the thin device wafer 60a and the thin device wafer 60a is peeled off from the adhesive carrier base material 100a as illustrated in FIG. 3 in order to release the extremely strong temporary adhesion, a problem in that the device chip 62 is damaged due to the structure being peeled off from the device chip 62 provided with the structure is likely to occur.

On the contrary, in a case where a temporary adhesive having poor adhesiveness is employed from among the temporary adhesives of the related art, the temporary support with respect to the device wafer can be easily released. However, in the first place, since the temporary adhesion between the device wafer and the carrier base material is extremely weak, a problem in that the device wafer cannot be reliably supported by the carrier base material is likely to occur.

On the contrary, the laminate of the present invention exhibits adhesiveness sufficiently and is capable of easily releasing the temporary adhesion between the device wafer 60 and the carrier base material 12. In other words, according to the laminate of the present invention, the device wafer 60 can temporarily adhere to the carrier base material using high adhesion force and the temporary adhesion with respect to the thin device wafer 60a can be easily released without damaging the thin device wafer 60a.

The method of manufacturing a semiconductor device of the present invention is not limited to the embodiments described above and modifications and improvements can be made as appropriate.

Further, in the embodiments described above, the silicon substrate is exemplified as a device wafer, but the embodiments are not limited thereto and any member to be treated which can be provided for the mechanical or chemical treatment in the method of manufacturing a semiconductor device can be used.

Further, in the embodiments described above, the treatment of reducing the thickness of the device wafer and the treatment of forming a through-silicon via are exemplified as the mechanical or chemical treatment to be performed on the device wafer (silicon substrate), but the embodiments are not limited thereto and any treatment required for the method of manufacturing a semiconductor device can be used.

In addition, the shape, the size, the number, and the arrangement sites of the device chips in the device wafer, which are exemplified in the above-described embodiments, are optional and are not limited.

EXAMPLES

Hereinafter, the present invention will be described in more detail with reference to the examples described below, but the present invention is not limited to the examples described below unless departing from the scope of the present invention. Further, "part" and "%" are on a mass basis unless otherwise noted.

<Preparation of Temporary Adhesion Composition>

Respective components of the following temporary adhesion composition were mixed to obtain a homogeneous solution and the solution was filtered using a polytetrafluoroethylene filter having a pore diameter of 5 μm, thereby preparing a temporary adhesion composition.

Composition of Temporary Adhesion Composition Examples 1 to 14, 17, and 18 and Comparative Examples 6 to 9)

Binders listed in Table 1: parts by mass listed in Table 1

Irganox 1010 (manufactured by BASF Japan Ltd.): 5 parts by mass

Sumilizer TP-D (manufactured by SUMITOMO CHEMICAL Co., Ltd.): 5 parts by mass

MEGAFACE F-553 (manufactured by DIC Corporation): 0.1 parts by mass

Mesitylene (manufactured by Toyo Gosei Co., Ltd.): 190 parts by mass

Composition of Temporary Adhesion Composition (Example 15)

Resin P-6: parts by mass listed in Table 1

Irganox 1010 (manufactured by BASF Japan Ltd.): 10 parts by mass

Sumilizer TP-D (manufactured by SUMITOMO CHEMICAL Co., Ltd.): 10 parts by mass

Anisole (manufactured by Toyo Gosei Co., Ltd.): 400 parts by mass

TOTM (manufactured by DAIHACHI CHEMICAL INDUSTRY CO., LTD.): 3 parts by mass

MEGAFACE F-553 (manufactured by DIC Corporation): 0.1 parts by mass

Composition of Temporary Adhesion Composition (Example 16)

Resin P-7: parts by mass listed in Table 1

Irganox 1010 (manufactured by BASF Japan Ltd.): 10 parts by mass

Sumilizer TP-D (manufactured by SUMITOMO CHEMICAL Co., Ltd.): 10 parts by mass

N-ethyl-2-pyrrolidone (manufactured by MARUZEN CHEMICAL TRADING CO, LTD.): 400 parts by mass TOTM (manufactured by DAIHACHI CHEMICAL INDUSTRY CO., LTD.): 3 parts by mass MEGAFACE F-553 (manufactured by DIC Corporation): 0.1 parts by mass Composition of Temporary Adhesion Composition
(Example 19)

Binders listed in Table 1: parts by mass listed in Table 1
Irganox 1010 (manufactured by BASF Japan. Ltd.): 1 parts by mass
Sumilizer TP-D (manufactured by SUMITOMO CHEMICAL Co., Ltd.): 1 parts by mass
KP-341 (manufactured by Shin-Etsu Chemical Co., Ltd.): 0.05 parts by mass
Mesitylene (manufactured by Toyo Gosei Co., Ltd.): 300 parts by mass Composition of Temporary Adhesion Composition
(Example 20)

A temporary adhesion composition was prepared in the same manner as in Example 19 except that the amount of KP-341 was set to 0.002 parts by mass.

Composition of Temporary Adhesion Composition
(Example 21)

A temporary adhesion composition was prepared in the same manner as in Example 19 except that the amount of KP-341 was set to 0.9 parts by mass.

Composition of Temporary Adhesion Composition
(Example 15)

Resin P-6: parts by mass listed in Table 1
Irganox 1010 (manufactured by BASF Japan Ltd.): 10 parts by mass
Sumilizer TP-D (manufactured by SUMITOMO CHEMICAL Co., Ltd.): 10 parts by mass
Anisole (manufactured by Toyo Gosei Co., Ltd.): 400 parts by mass
TOTM (manufactured by DAIHACHI CHEMICAL INDUSTRY CO., LTD.): 3 parts by mass
MEGAFACE F-553 (manufactured by DIC Corporation): 0.1 parts by mass Composition of Temporary Adhesion Composition
(Example 16)

Resin P-7: parts by mass listed in Table 1
Irganox 1010 (manufactured by BASF Japan Ltd.): 10 parts by mass
Sumilizer TP-D (manufactured by SUMITOMO CHEMICAL Co., Ltd.): 10 parts by mass
N-ethyl-2-pyrrolidone (manufactured by MARUZEN CHEMICAL TRADING CO, LTD.): 400 parts by mass
TOTM (manufactured by DAIHACHI CHEMICAL INDUSTRY CO., LTD.): 3 parts by mass
MEGAFACE F-553 (manufactured by DIC Corporation): 0.1 parts by mass Composition of Temporary Adhesion Composition
(Comparative Example 1)

Resin P-6: parts by mass listed in Table 1
Irganox 1010 (manufactured by BASF Japan Ltd.): 10 parts by mass
Sumilizer TP-D (manufactured by SUMITOMO CHEMICAL Co., Ltd.): 10 parts by mass
Anisole (manufactured by Toyo Gosei Co., Ltd.): 400 parts by mass
TOTM (manufactured by DAIHACHI CHEMICAL INDUSTRY CO., LTD.): 0.8 parts by mass
MEGAFACE F-553 (manufactured by DIC Corporation): 0.1 parts by mass Composition of Temporary Adhesion Composition
(Comparative Example 2)

Resin P-6: parts by mass listed in Table 1
Irganox 1010 (manufactured by BASF Japan Ltd.): 10 parts by mass
Sumilizer TP-D (manufactured by SUMITOMO CHEMICAL Co., Ltd.): 10 parts by mass
Anisole (manufactured by Toyo Gosei Co., Ltd.): 400 parts by mass
TOTM (manufactured by DAIHACHI CHEMICAL INDUSTRY CO., LTD.): 0.5 parts by mass
MEGAFACE F-553 (manufactured by DIC Corporation): 0.1 parts by mass Composition of Temporary Adhesion Composition
(Comparative Example 3)

Resin P-7: parts by mass listed in Table 1
Irganox 1010 (manufactured by BASF Japan Ltd.): 10 parts by mass
Sumilizer TP-D (manufactured by SUMITOMO CHEMICAL Co., Ltd.): 10 parts by mass
N-ethyl-2-pyrrolidone (manufactured by MARUZEN CHEMICAL TRADING CO, LTD.): 400 parts by mass
TOTM (manufactured by DAIHACHI CHEMICAL INDUSTRY CO., LTD.): 0.8 parts by mass
MEGAFACE F-553 (manufactured by DIC Corporation): 0.1 parts by mass Composition of Temporary Adhesion Composition
(Comparative Example 4)

Resin P-7: parts by mass listed in Table 1
Irganox 1010 (manufactured by BASF Japan Ltd.): 10 parts by mass
Sumilizer TP-D (manufactured by SUMITOMO CHEMICAL Co., Ltd.): 10 parts by mass
N-ethyl-2-pyrrolidone (manufactured by MARUZEN CHEMICAL TRADING CO, LTD.): 400 parts by mass
TOTM (manufactured by DAIHACHI CHEMICAL INDUSTRY CO., LTD.): 0.5 parts by mass
MEGAFACE F-553 (manufactured by DIC Corporation): 0.1 parts by mass Composition of Temporary Adhesion Composition
(Comparative Example 5)

Resin P-8: parts by mass listed in Table 1
Irganox 1010 (manufactured by BASF Japan Ltd.): 5 parts by mass
Sumilizer TP-D (manufactured by SUMITOMO CHEMICAL Co., Ltd.): 5 parts by mass
2-Heptane (manufactured by KH Neochem Co., Ltd.): 200 parts by mass
MEGAFACE F-553 (manufactured by DIC Corporation): 0.1 parts by mass

TABLE 1

|  | Resin 1 | | Resin 2 | | Device wafer | Carrier base material |
|---|---|---|---|---|---|---|
|  | Type | Parts by mass | Type | Parts by mass | | |
| Example 1 | P-1 | 45.0 | P-3 | 45.0 | Silicon | Silicon |
| Example 2 | P-1 | 53.9 | P-3 | 36.0 | Silicon | Silicon |
| Example 3 | P-1 | 36.0 | P-3 | 53.9 | Silicon | Silicon |
| Example 4 | P-1 | 45.0 | P-4 | 45.0 | Silicon | Silicon |
| Example 5 | P-1 | 53.9 | P-4 | 36.0 | Silicon | Silicon |
| Example 6 | P-1 | 40.5 | P-4 | 49.4 | Silicon | Silicon |
| Example 7 | P-2 | 45.0 | P-3 | 45.0 | Silicon | Silicon |
| Example 8 | P-2 | 53.9 | P-3 | 36.0 | Silicon | Silicon |
| Example 9 | P-2 | 36.0 | P-3 | 53.9 | Silicon | Silicon |
| Example 10 | P-2 | 45.0 | P-4 | 45.0 | Silicon | Silicon |
| Example 11 | P-2 | 41.4 | P-4 | 48.5 | Silicon | Silicon |
| Example 12 | P-2 | 53.9 | P-4 | 36.0 | Silicon | Silicon |
| Example 13 | P-1 | 18.0 | P-3 | 71.9 | Silicon | Silicon |
| Example 14 | P-1 | 9.0 | P-4 | 80.9 | Silicon | Silicon |
| Example 15 | P-5 | 89.9 | None | — | Silicon | Silicon |
| Example 16 | P-6 | 89.9 | None | — | Silicon | Silicon |
| Example 17 | P-1 | 45.0 | P-3 | 45.0 | Silicon | Glass |
| Example 18 | P-1 | 45.0 | P-3 | 45.0 | Silicon | Silicon |
| Example 19 | P-1 | 30.0 | P-3 | 70.0 | Silicon | Silicon |
| Example 20 | P-1 | 30.0 | P-3 | 70.0 | Silicon | Silicon |
| Example 21 | P-1 | 30.0 | P-3 | 70.0 | Silicon | Silicon |
| Comparative Example 1 | P-5 | 89.9 | None | — | Silicon | Silicon |
| Comparative Example 2 | P-5 | 89.9 | None | — | Silicon | Silicon |
| Comparative Example 3 | P-6 | 89.9 | None | — | Silicon | Silicon |
| Comparative Example 4 | P-6 | 89.9 | None | — | Silicon | Silicon |
| Comparative Example 5 | P-7 | 89.9 | None | — | Silicon | Silicon |
| Comparative Example 6 | P-1 | 4.5 | P-3 | 85.4 | Silicon | Silicon |
| Comparative Example 7 | P-2 | 4.5 | P-3 | 85.4 | Silicon | Silicon |
| Comparative Example 8 | P-3 | 89.9 | None | — | Silicon | Silicon |
| Comparative Example 9 | P-4 | 89.9 | None | — | Silicon | Silicon |

The trade names and the names of manufacturers of the compounds listed in Table 1 are as follows.
<Binder>

TABLE 2

|  | Resin | |
|---|---|---|
| Symbol | Trade name | Manufacture |
| P-1 | SEPTON 2104 | Kuraray Co., Ltd. |
| P-2 | TUFTEC P2000 | Asahi Kasei Corporation |
| P-3 | SEPTON 4033 | Kuraray Co., Ltd. |
| P-4 | KRATON G1652 MU-1000 | Kraton Corporation |
| P-5 | APEC 9379 | BAYER AG |
| P-6 | Ultrason E6020P | BASF Japan Ltd. |
| P-7 | ESTYREN MS-200 | NIPPON STEEL & SUMIKIN CHEMICAL CO., LTD. |

Formation of Laminate (Examples 1 to 16 and 18 to 21 and Comparative Examples 1 to 11)

A plurality of bumps were provided, and 15 mL of the temporary adhesion composition listed in Table 1 was added dropwise, for 30 seconds, to a surface of a silicon wafer having a diameter of 12 inches (1 inch corresponds to 2.54 which an edge trimming treatment was performed such that the width thereof was set to 500 μm and the depth thereof was set to 100 μm while rotating the silicon wafer at 50 rpm using a wafer bonding device (manufactured by Tokyo Electron Limited, Synapse V). The rotation speed was increased to 600 rpm and the state was held for 30 seconds. Thereafter, mesitylene was supplied to the outer peripheral portion of the silicon wafer and the rear surface of the silicon wafer for 40 seconds while rotating the silicon wafer, and then the temporary adhesion composition adhering to the outer peripheral portion of the silicon wafer and the rear surface of the silicon wafer was washed. The silicon wafer was heated at 110° C. for 3 minutes and further heated at 190° C. for 3 minutes using a hot plate, thereby forming a temporary adhesion film on the surface of the silicon wafer.

Next, one more silicon wafer (carrier base material) having a diameter of 12 inches was crimped to the surface on a side where the temporary adhesion film was formed in a vacuum under a temperature condition of 190° C. at a pressure of 0.1.1 MPa for 3 minutes using a wafer bonding device (manufactured by Tokyo Electron Limited, Synapse V), thereby obtaining a laminate. Further, the thickness of the temporary adhesion film was 40 μm.

Next, the silicon wafer side of the laminate which was used earlier was polished up to a thickness of 35 μm using a back grinder DFG8540 (manufactured by DISCO Corporation), thereby obtaining a thinned laminate.

The diameter of the thinned silicon wafer of the laminate was 299 mm.

Formation of Laminate (Example 17)

A laminate was prepared in the same manner as in Example 1 except that the carrier base material was changed to glass (EAGLE XG, manufactured by Corning incorporated).

Treatment on End Surface of Thinned Laminate (Examples 1 to 17 and 19 to 21 and Comparative Examples 1 to 9)

15 mL of mesitylene was added dropwise to a position from the end portion of the silicon wafer to the inside the end portion by 20 mm for 10 seconds while rotating the thinned laminate at 300 rpm using a wafer bonding device (manufactured by Tokyo Electron Limited, Synapse V) after the carrier base material was set as the lower surface. Next, the rotation speed was increased to 1000 rpm and 45 mL, of mesitylene was added dropwise thereto for 30 seconds. Thereafter, the laminate was rotated for 20 seconds while the rotation speed thereof was held to 1000 rpm so that the surface of the silicon wafer was dried.

As a result of observation performed on the obtained laminate using an optical microscope from a direction perpendicular to the silicon wafer having a diameter of 12 inches provided with a plurality of bumps, it was confirmed that the diameter of the base material surface of the temporary adhesion film is smaller than the diameter of the base material surface of the carrier base material by 250 μm or greater. Further, the diameter of the film surface of the temporary adhesion film on a side where the temporary adhesion film was in contact with the carrier base material was greater than the diameter of the film surface of the temporary adhesion film on a side where the temporary adhesion film was in contact with the device wafer.

Formation of Laminate (Example 18)

A laminate was prepared in the same manner as in Example 1 except that the end surface treatment after the laminate was thinned was not performed.

As a result of observation performed on the obtained laminate using an optical microscope from an upper portion of the silicon wafer having a diameter of 12 inches provided with a plurality of bumps, it was confirmed that the diameter of the temporary adhesion film was 150 µm or less with respect to the diameter of the carrier base material. Further, the diameter of the film surface of the temporary adhesion film on a side where the temporary adhesion film was in contact with the carrier base material was greater than the diameter of the film surface of the temporary adhesion film on a side where the temporary adhesion film was in contact with the device wafer.

<Warpage of Wafer after Laminate was Thinned>

The warpage (curvature radius) of the thinned laminate was measured using a thin film stress determination device FLX-2320-S (manufactured by Toho Technology Corp.) and the evaluation was performed based on the following standard. Further, the evaluation was performed based on the absolute values regardless of the direction of warpage.

A: The value of warpage was 20 µm or less

B: The value of warpage was greater than 20 µm and 40 µm or less

C: The value of warpage was greater than 40 µm

<Evaluation of Floating after Laminate was Thinned>

The wafer edge of the thinned laminate was observed and the evaluation was performed based on the following standard.

A: The wafer edge was completely bonded by the temporary adhesive.

B: A part of the wafer edge was peeled off so that the wafer and the temporary adhesive were separated from each other.

C: The wafer edge was peeled off over the entire circumference so that the wafer and the temporary adhesive were separated from each other.

<Evaluation of Peeling after Laminate was Thinned>

The polished surface of the thinned laminate was set to be directed to the lower side, and the silicon wafer on the lower side and a dicing frame were fixed together to the center of dicing tape using dicing tape mounter. Thereafter, the silicon wafer on the upper side was pulled up in the direction perpendicular to the silicon wafer on the lower side at 25° C. at a speed of 50 mm/min using a wafer bonder/debonder (manufactured by Tokyo Electron Limited, Synapse Z), and it was confirmed whether the silicon wafer can be peeled off at a force of 0.33 N/mm or less without breaking the other silicon wafer. Further, the force was measured using a force gauge (ZTS-100N, manufactured by IMADA CO., LTD.).

When the silicon wafer was able to be peeled off without breaking the silicon wafer on the side of pulling-up, "possible" was noted in the columns of the table, and "impossible" was noted in other cases.

<Measurement of Tensile Elastic Modulus E of Temporary Adhesion Film>

A temporary adhesion film for measurement in the present test was produced by the following method.

15 mL of the temporary adhesion composition listed in Table 1 was added dropwise to the surface of the silicon wafer having a diameter of 8 inches for 30 seconds while rotating the silicon wafer at 50 rpm using a spin coater (MS-A300, manufactured by MIKASA CO., LID.). Next, the rotation speed was increased to 600 rpm and then the state was held for 30 seconds. The silicon wafer was heated at 110° C. for 3 minutes and further heated at 190° C. for 3 minutes using a hot plate, thereby forming a temporary adhesion film on the surface of the silicon wafer. Thereafter, the temporary adhesion film was manually peeled off from the silicon wafer.

A tensile elastic modulus E of the obtained temporary adhesion film for measurement in the present test was measured under the condition in which the temperature of the temporary adhesion film was set to 25° C. in conformity with JIS K7161:1994. The results are listed in the following table. The unit is MPa.

<Measurement of Surface Free Energy of Temporary Adhesion Film>

A temporary adhesion film for measurement in the present test was produced by the following method.

15 mL of the temporary adhesion composition listed in Table 1 was added dropwise to the surface of the silicon wafer having a diameter of 8 inches for 30 seconds while rotating the silicon wafer at 50 rpm using a spin coater (MS-A300, manufactured by MIKASA CO., LTD). Next, the rotation speed was increased to 600 rpm and then the state was held for 30 seconds. The silicon wafer was heated at 110° C. for 3 minutes and further heated at 190° C. for 3 minutes using a hot plate, thereby forming a temporary adhesion film on the surface of the silicon wafer. Thereafter, the temporary adhesion film was manually peeled off from the silicon wafer.

The surface free energy of the obtained temporary adhesion film for measurement in the present test was obtained by measuring each contact angle formed when 3 µL of water, 3 µL of ethylene glycol, and 3 µL of diiodomethane were respectively dropped onto the temporary adhesion film using a contact angle meter (DM-301, manufactured by Kyowa Interface Science Co., Ltd.), establishing a simultaneous linear equation from the extended Fowkes equation using analysis software "FAMAS" (incorporated in DM-301 described above), and acquiring the solution. The results are listed in the following table. The unit is $mJ/m^2$.

<Measurement of Shear Storage Elastic Modulus G' of Temporary Adhesion Film>

The shear storage elastic modulus G' of the temporary adhesion film was measured using the temporary adhesion film for measurement in the present test which was produced for the measurement of the tensile elastic modulus E of the temporary adhesion film under the condition in which the temperature of the temporary adhesion film was set to 190° C. in conformity with JIS K7244-6:1999. The results are listed in the following table. The unit is MPa.

<Measurement of Tensile Storage Elastic Modulus E' of Temporary Adhesion Film>

The tensile storage elastic modulus E' of the temporary adhesion film was measured using the temporary adhesion film for measurement in the present test which was produced for the measurement of the tensile elastic modulus E of the temporary adhesion film under the condition in which the temperature of the temporary adhesion film was set to 25° C. in conformity with JIS K7244-4:1999. The results are listed in the following table. The unit is MPa.

<Melt Viscosity>

A temporary adhesion film for measurement in the present test was produced by the following method. 15 mL of the temporary adhesion composition listed in Table 1 was added dropwise to the surface of the silicon wafer having a diameter of 8 inches for 30 seconds while rotating the silicon wafer at 50 rpm using a spin coater (MS-A300, manufactured by MIKASA CO., LTD.). Next, the rotation speed was increased to 300 rpm and then the state was held for 30 seconds. The silicon wafer was heated at 110° C. for 3 minutes and further heated at 190° C. for 3 minutes using a hot plate, thereby forming a temporary adhesion film on the surface of the silicon wafer. Thereafter, the temporary adhesion film was manually peeled off from the silicon wafer.

The melt viscosity of the temporary adhesion film was measured using the obtained temporary adhesion film for measurement in the present test by increasing the temperature at a speed of 5° C./min at 250° C. in conformity with JIS K 6862:1984.

The results are listed in the following table. The unit is Pa·s.

<Melt Flow Rate (MFR)>

The MFR of the temporary adhesion film was measured using the temporary adhesion film for measurement in the present test which was produced for the measurement of the melt viscosity of the temporary adhesion film under the condition in which the temperature of the temporary adhesion film was set to 200° C. at a load of 10 Kg in conformity with JIS K 7210:1999.

The results are listed in the following table. The unit is g/10 min.

<Plastic Deformation Starting Pressure $P_{60}$>

The silicon wafer was coated with the temporary adhesion composition according to a spin coating method and a temporary adhesion film having a thickness of 40 μm was formed, thereby obtaining a test piece. With the obtained test piece, chips made of silicon having a size of 5 mm×10 mm were pressed for 5 seconds from a direction perpendicular to the film surface of the temporary adhesion film under the condition in which the temporary adhesion film was set to 60° C. After the chips were removed, the sites in contact with the chips were observed using an optical microscope and the force when the film thickness at a pressed site was decreased by 10 μm or greater was set to plastic deformation starting pressure. The unit is MPa.

TABLE 3

| | Tensile elastic modulus E | Surface free energy | Shear storage elastic modulus G' | Tensile storage elastic modulus E' | E'/G' | Melt viscosity | MFR | Plastic deformation starting pressure | Peeling | Floating | Warpage |
|---|---|---|---|---|---|---|---|---|---|---|---|
| Example 1 | 58 | 24 | 0.34 | 395 | 1162 | 13050 | 11 | 0.54 | Possible | | A |
| Example 2 | 65 | 24 | 0.32 | 452 | 1430 | 12660 | 13.2 | 0.45 | Possible | | A |
| Example 3 | 50 | 24 | 0.36 | 338 | 929 | 13440 | 8.8 | 0.63 | Possible | | A |
| Example 4 | 59 | 25 | 0.36 | 400 | 1111 | 12300 | 12 | 0.44 | Possible | | A |
| Example 5 | 66 | 26 | 0.33 | 456 | 1373 | 12060 | 14 | 0.37 | Possible | | B |
| Example 6 | 55 | 25 | 0.37 | 372 | 995 | 12420 | 11 | 0.48 | Possible | | B |
| Example 7 | 48 | 27 | 0.32 | 380 | 1188 | 12750 | 11.5 | 0.53 | Possible | | A |
| Example 8 | 53 | 27 | 0.29 | 434 | 1486 | 12300 | 13.8 | 0.44 | Possible | | A |
| Example 9 | 42 | 26 | 0.35 | 326 | 937 | 13200 | 9.2 | 0.62 | Possible | | A |
| Example 10 | 49 | 27 | 0.34 | 385 | 1132 | 12000 | 12.5 | 0.43 | Possible | | A |
| Example 11 | 46 | 27 | 0.35 | 363.8 | 1031 | 12120 | 11.66 | 0.46 | Possible | | A |
| Example 12 | 54 | 28 | 0.31 | 438 | 1422 | 11700 | 14.6 | 0.36 | Possible | | A |
| Example 13 | 35 | 26 | 0.41 | 224 | 544 | 14220 | 4.4 | 0.82 | Possible | | B |
| Example 14 | 29 | 24 | 0.47 | 176 | 373 | 13260 | 4 | 0.73 | Possible | | B |
| Example 15 | 1200 | 28 | 0.17 | 529 | 3112 | 11000 | 15 | 50.00 | Possible | | B |
| Example 16 | 1250 | 28 | 0.27 | 500 | 1852 | 16500 | 17 | 50.00 | Possible | | B |

TABLE 4

| | Tensile elastic modulus E | Surface free energy | Shear storage elastic modulus G' | Tensile storage elastic modulus E' | E'/G' | Melt viscosity | MFR | Plastic deformation starting pressure | Peeling | Floating | Warpage |
|---|---|---|---|---|---|---|---|---|---|---|---|
| Example 17 | 58 | 24 | 0.34 | 395 | 1162 | 13050 | 11 | 0.54 | Possible | | A |
| Example 18 | 57 | 24 | 0.14 | 402 | 2871 | 15680 | 1.5 | 0.64 | Possible | | A |
| Example 19 | 30 | 23 | 0.39 | 182 | 467 | 57890 | 0.2 | 0.32 | Possible | A | A |
| Example 20 | 30 | 24 | 0.42 | 170 | 405 | 60250 | 0.1 | 0.21 | Impossible | A | A |
| Example 21 | 30 | 26 | 0.39 | 162 | 415 | 57920 | 0.2 | 0.33 | Possible | B | A |
| Comparative Example 1 | 2080 | 27 | 0.19 | 859 | 4474 | 11000 | 15 | 50.00 | Impossible | | B |
| Comparative Example 2 | 2200 | 28 | 0.20 | 904 | 4636 | 11000 | 15 | 50.00 | Impossible | | C |
| Comparative Example 3 | 2130 | 28 | 0.29 | 830 | 2842 | 16500 | 25 | 50.00 | Impossible | | C |
| Comparative Example 4 | 2250 | 28 | 0.30 | 875 | 2966 | 16500 | 25 | 50.00 | Impossible | | C |
| Comparative Example 5 | 2160 | 23 | 0.10 | 122 | 1220 | 4000 | 15 | 50.00 | Impossible | | C |
| Comparative Example 6 | 24 | 24 | 0.45 | 138.5 | 309 | 14805 | 1.1 | 0.95 | Impossible | | C |
| Comparative Example 7 | 23 | 23 | 0.45 | 137 | 307 | 14775 | 1.15 | 0.95 | Impossible | | C |
| Comparative Example 8 | 20 | 24 | 0.46 | 110 | 239 | 15000 | 0 | 1.00 | Impossible | | C |
| Comparative Example 9 | 22 | 25 | 0.50 | 120 | 240 | 13500 | 2 | 0.80 | Impossible | | C |

As evident from the results described above, the laminate of the present invention was able to be peeled off under predetermined conditions and the laminate which was unlikely to be warped was obtained even after the laminate was thinned. On the contrary, the laminates of the comparative examples were not able to be peeled off.

Particularly, it was possible to effectively suppress the floating by setting the amount of the silicone compound to be formulated to be small.

EXPLANATION OF REFERENCES 11, 11a: temporary adhesion film
12: carrier base material
60: device wafer
60a: thin device wafer
61: silicon substrate
61a: surface
61b, 61b1: rear surface
62: device chip
63: structure
70: tape
100, 100a: adhesive carrier base material

What is claimed is:

1. A laminate comprising, sequentially being adjacent to each other:
a first base material;
a temporary adhesion film; and
a second base material,
wherein a tensile elastic modulus E of the temporary adhesion film at 25° C. in conformity with JIS K 7161:1994 is in a range of 25 to 2000 MPa,
the first base material and the second base material are peelable from each other by fixing any one of a first base material and a second base material of the laminate at 25° C. and pulling an end portion of the other base material up in a direction perpendicular to the base material surface of the other base material from an interface with the temporary adhesion film at a speed of 50 mm/min, and
the force value applied during the pulling-up measured by using a force gauge is 0.33 N/mm or less.

2. The laminate according to claim 1,
wherein a surface free energy of the temporary adhesion film is 30 mJ/m² or less,
where the surface free energy indicates a value obtained according to the extended Fowkes equation on the basis of the Kitazaki-Hata theory based on a contact angle of water, ethylene glycol, or diiodomethane with respect to the temporary adhesion film.

3. The laminate according to claim 1,
wherein a shear storage elastic modulus G' of the temporary adhesion film at 190° C. in conformity with JIS K 7244-6:1999 is in a range of 0.1 to 1 MPa.

4. The laminate according to claim 1,
wherein a tensile storage elastic modulus E' of the temporary adhesion film at 25° C. in conformity with JIS K 7244-4:1999 is in a range of 150 to 900 MPa.

5. The laminate according to of claim 1,
wherein a ratio E'/G' of the tensile storage elastic modulus E' of the temporary adhesion film at 25° C. in conformity with JIS K 7244-4:1999 to the shear storage elastic modulus G' of the temporary adhesion film at 190° C. in conformity with JIS K 7244-6:1999 satisfies a relationship of E'/G'≤3500.

6. The laminate according to claim 1,
wherein a melt viscosity of the temporary adhesion film at 250° C. in conformity with JIS K 6862:1984 is 10000 Pa·s or greater,
wherein a temperature rising rate in the temperature region from room temperature to 250° C. is 5° C./min.

7. The laminate according to claim 1,
wherein a melt flow rate of the temporary adhesion film at 200° C. and at a load of 10 kg in conformity with JIS K 7210:1999 is 20.0 g/10 min or less.

8. The laminate according to claim 1,
wherein a plastic deformation starting pressure $P_{60}$ of the temporary adhesion film at 60° C. is 0.2 MPa or greater.

9. The laminate according to claim 1,
wherein one of the first base material and the second base material is a carrier base material and the other is a device wafer.

10. The laminate according to claim 9,
wherein the area of the film surface of the temporary adhesion film is smaller than the area of the base material surface of the carrier base material.

11. The laminate according to claim 9,
wherein an inequation of "(C−200)≥T≥D" is satisfied when the diameter of the base material surface of the carrier base material is set to C μm, the diameter of the base material surface of the device wafer is set to D μm, and the diameter of the film surface of the temporary adhesion film is set to T μm.

12. The laminate according to claim 9,
wherein an inequation of "(C−200)≥$T_C$≥$T_D$≥D" is satisfied when the diameter of the base material surface of the carrier base material is set to C μm, the diameter of the base material surface of the device wafer is set to D μm, the diameter of the film surface of the temporary adhesion film on a side where the temporary adhesion film is in contact with the carrier base material is set to $T_C$ μm, and the diameter of the film surface on a side where the temporary adhesion film is in contact with the device wafer is set to $T_D$ μm.

13. The laminate according to claim 1,
wherein one of the first base material and the second base material is a carrier base material and the other is a device wafer having a thickness of 200 μm or less.

14. The laminate according to claim 1,
wherein the temporary adhesion film contains a silicone compound in a proportion of 0.001 to 1% by mass with respect to a solid content in the temporary adhesion film.

15. A temporary adhesion composition used for a laminate which includes a first base material, a temporary adhesion film obtained by film formation using a temporary adhesion composition, and a second base material sequentially being adjacent to each other,
wherein the first base material and the second base material are peelable from each other by fixing any one of a first base material and a second base material of the laminate at 25° C. and pulling an end portion of the other base material up in a direction perpendicular to the surface of the other base material from an interface with the temporary adhesion film at a speed of 50 mm/min, and
the force value applied during the pulling-up is measured by using a force gauge is 0.33 N/mm or less.

16. A temporary adhesion film,
wherein a tensile elastic modulus E at 25° C. in conformity with JIS K 7161:1994 is in a range of 25 to 2000 MPa,
a surface free energy is 30 mJ/m² or less, a shear storage elastic modulus G' at 190° C. in conformity with JIS K 7244-6:1999 is in a range of 0.1 to 1 MPa, a tensile storage elastic modulus E' at 25° C. in conformity with JIS K 7244-4:1999 is in a range of 150 to 900 MPa, a ratio E'/G' of the tensile storage elastic modulus E' at 25° C. in conformity with JIS K 7244-4:1999 to the shear storage elastic modulus G' of the temporary adhesion film at 190° C. in conformity with JIS K 7244-6:1999 satisfies a relationship of E'/G'≤3500, a melt viscosity at 250° C. is 10000 Pa·s or greater, a melt flow rate at 200° C. and at a load of 10 kg in conformity with JIS K 7210:1999 is 20.0 g/10 min or less, and a plastic deformation starting pressure $P_{60}$ at 60° C. is 0.2 MPa or greater, wherein a temperature rising rate in the temperature region from room temperature to 250° C. to measure the melt viscosity is 5° C./min, where the surface free energy indicates a value obtained according to the extended Fowkes equation on the basis of the Kitazaki-Hata theory based on a contact angle of water, ethylene glycol, or diiodomethane with respect to the temporary adhesion film.

* * * * *